United States Patent
Itoh et al.

(10) Patent No.: US 7,957,444 B2
(45) Date of Patent: Jun. 7, 2011

(54) SURFACE-EMISSION LASER DIODE, SURFACE-EMISSION LASER DIODE ARRAY, OPTICAL SCANNING APPARATUS AND IMAGE FORMING APPARATUS

(75) Inventors: Akihiro Itoh, Miyagi (JP); Shunichi Sato, Miyagi (JP)

(73) Assignee: Ricoh Company, Ltd., Tokyo (JP)

( * ) Notice: Subject to any disclaimer, the term of this patent is extended or adjusted under 35 U.S.C. 154(b) by 242 days.

(21) Appl. No.: 12/090,934

(22) PCT Filed: Aug. 13, 2007

(86) PCT No.: PCT/JP2007/066069
§ 371 (c)(1),
(2), (4) Date: Apr. 21, 2008

(87) PCT Pub. No.: WO2008/026460
PCT Pub. Date: Mar. 6, 2008

(65) Prior Publication Data
US 2009/0262770 A1    Oct. 22, 2009

(30) Foreign Application Priority Data

Aug. 30, 2006  (JP) .................................. 2006-233906
Jul. 4, 2007   (JP) .................................. 2007-176356

(51) Int. Cl.
*H01S 5/00* (2006.01)
(52) U.S. Cl. .................. 372/46.01; 372/46.013
(58) Field of Classification Search ............. 372/45.01, 372/46.01, 46.013
See application file for complete search history.

(56) References Cited

U.S. PATENT DOCUMENTS

| | | | |
|---|---|---|---|
| 5,331,654 A | 7/1994 | Jewell et al. | |
| 5,727,014 A | 3/1998 | Wang et al. | |
| 6,057,565 A * | 5/2000 | Yoshida et al. | 257/102 |
| 6,207,973 B1 | 3/2001 | Sato et al. | |
| 6,542,528 B1 | 4/2003 | Sato et al. | |
| 6,556,607 B1 | 4/2003 | Jewell | |
| 6,563,851 B1 | 5/2003 | Jikutani et al. | |
| 6,614,821 B1 | 9/2003 | Jikutani et al. | |
| 6,674,785 B2 | 1/2004 | Sato et al. | |
| 6,765,232 B2 | 7/2004 | Takahashi et al. | |

(Continued)

FOREIGN PATENT DOCUMENTS

EP    0772269 A1    5/1997

(Continued)

OTHER PUBLICATIONS

Ha, K.-H. et al., "Polarisation anisotropy in asymmetric oxide aperture VCSELs," *Electronics Letters*, IEE Steveage, GB, vol. 34, No. 14, Jul. 9, 1998, pp. 1401-1402.

(Continued)

*Primary Examiner* — Minsun Harvey
*Assistant Examiner* — Phillip Nguyen
(74) *Attorney, Agent, or Firm* — Cooper & Dunham LLP

(57) ABSTRACT

A surface-emission laser diode of a vertical-cavity surface-emission laser structure includes a substrate and a mesa structure formed on the substrate, the mesa structure including therein a current confinement structure, wherein the current confinement structure includes a conductive current confinement region and an insulation region surrounding the conductive current confinement region, the insulation region being an oxide of a semiconductor material forming the conductive current confinement region, and wherein a center of the current confinement region is offset from a center of the mesa structure in a plane perpendicular to a laser oscillation direction.

11 Claims, 27 Drawing Sheets

U.S. PATENT DOCUMENTS

| | | | |
|---|---|---|---|
| 6,803,604 B2 | 10/2004 | Takahashi et al. | |
| 6,927,412 B2 | 8/2005 | Takahashi et al. | |
| 6,959,025 B2 | 10/2005 | Jikutani et al. | |
| 6,975,663 B2 | 12/2005 | Sekiya et al. | |
| 2002/0172247 A1 | 11/2002 | Sopra et al. | |
| 2003/0165171 A1* | 9/2003 | Jewell | 372/46 |
| 2004/0165636 A1 | 8/2004 | Ezaki et al. | |
| 2005/0169334 A1 | 8/2005 | Sato | |
| 2005/0230674 A1 | 10/2005 | Takahashi et al. | |
| 2005/0238075 A1 | 10/2005 | Jikutani et al. | |
| 2005/0286587 A1 | 12/2005 | Guenter | |
| 2006/0007979 A1 | 1/2006 | Jikutani et al. | |
| 2006/0054899 A1 | 3/2006 | Takahashi et al. | |
| 2006/0261352 A1 | 11/2006 | Takahashi et al. | |
| 2007/0014324 A1* | 1/2007 | Maeda et al. | 372/46.01 |
| 2007/0263687 A1 | 11/2007 | Takahashi et al. | |
| 2008/0212636 A1* | 9/2008 | Sato et al. | 372/50.11 |

FOREIGN PATENT DOCUMENTS

| | | |
|---|---|---|
| JP | 9-172218 | 6/1997 |
| JP | 11-307882 | 11/1999 |
| JP | 2001-358411 | 12/2001 |
| JP | 2003-182149 | 7/2003 |
| JP | 2005-353623 | 12/2005 |
| JP | 2006-13366 | 1/2006 |
| JP | 2006-128548 | 5/2006 |

OTHER PUBLICATIONS

Sakamoto, Akira et al., "Vertical-Cavity Surface-Emitting Lasers for Laser-Printer Applications," *Reza Kenkyu—Review of Laser Engineering*, vol. 29, No. 12, Dec. 2001, pp. 797-802.

Nov. 22, 2010 European official action in connection with counterpart European patent application No. 07 792 685.

\* cited by examiner

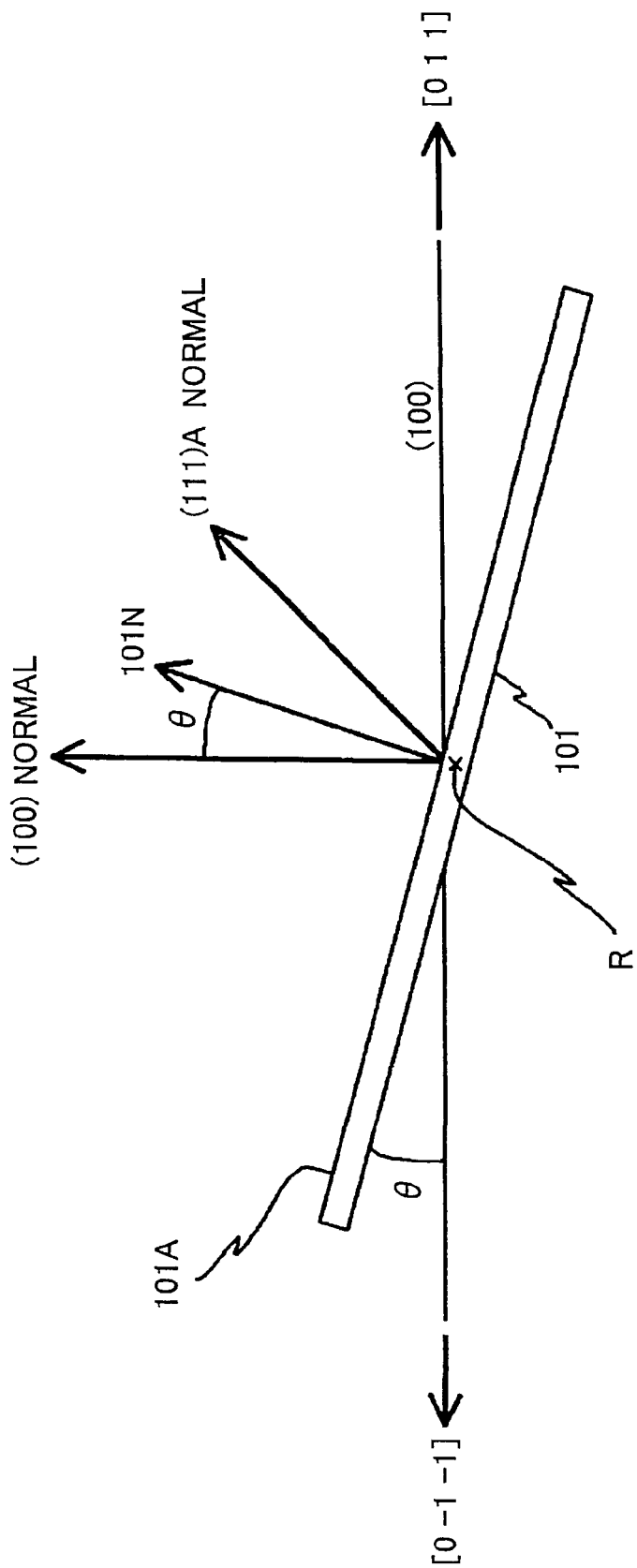

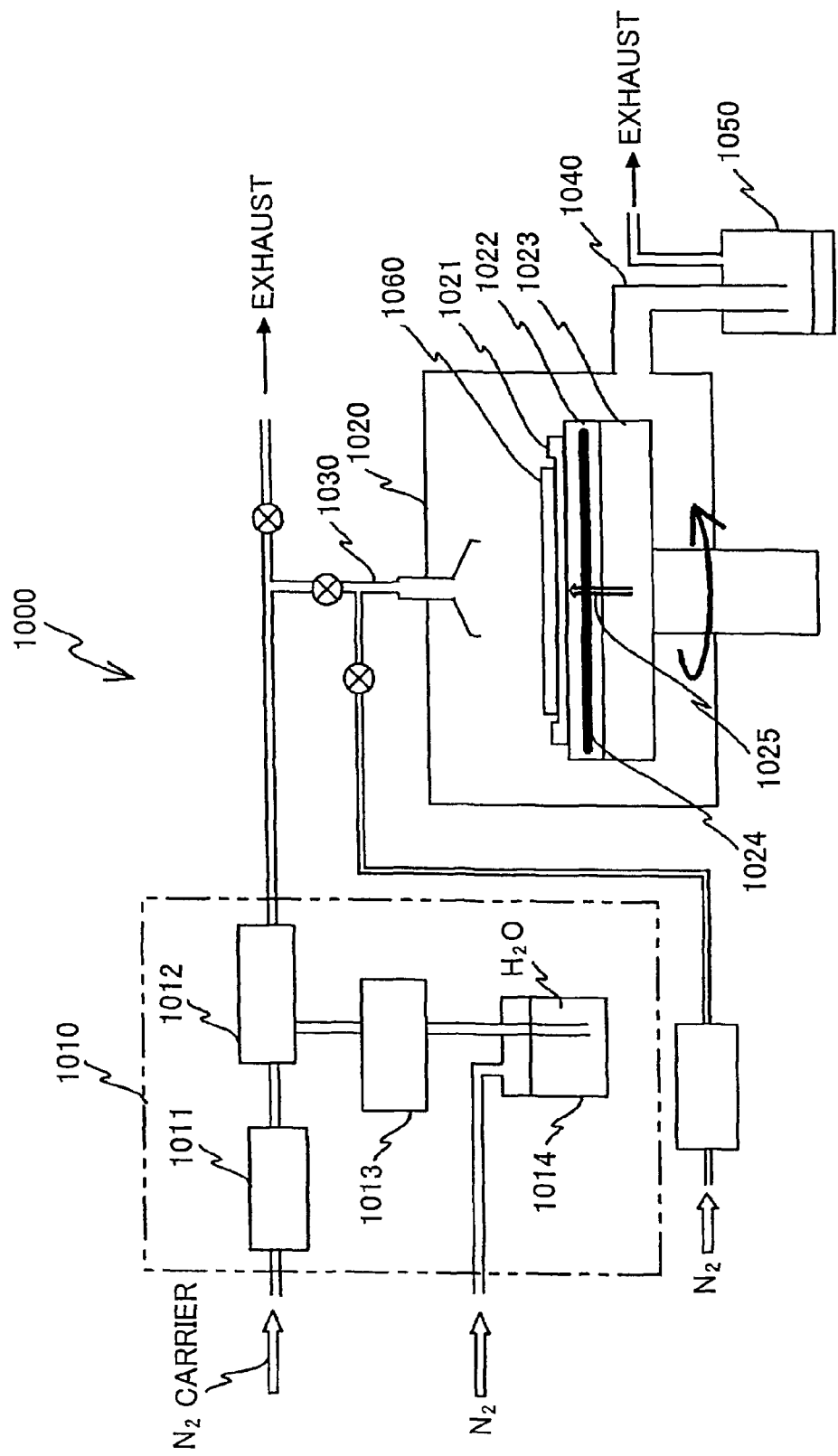

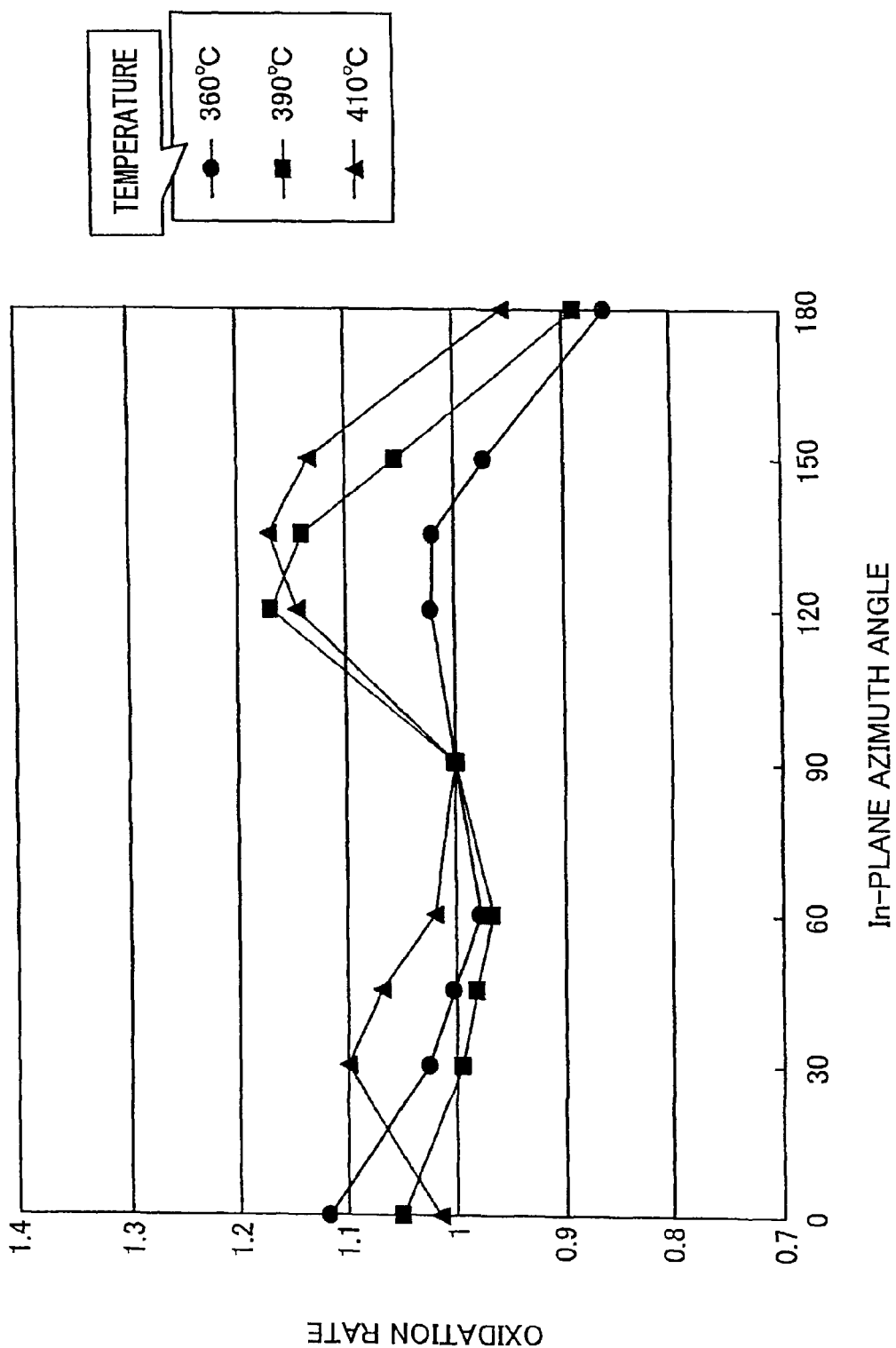

HEAT FLOW   HEAT FLOW n1 > n2, n3

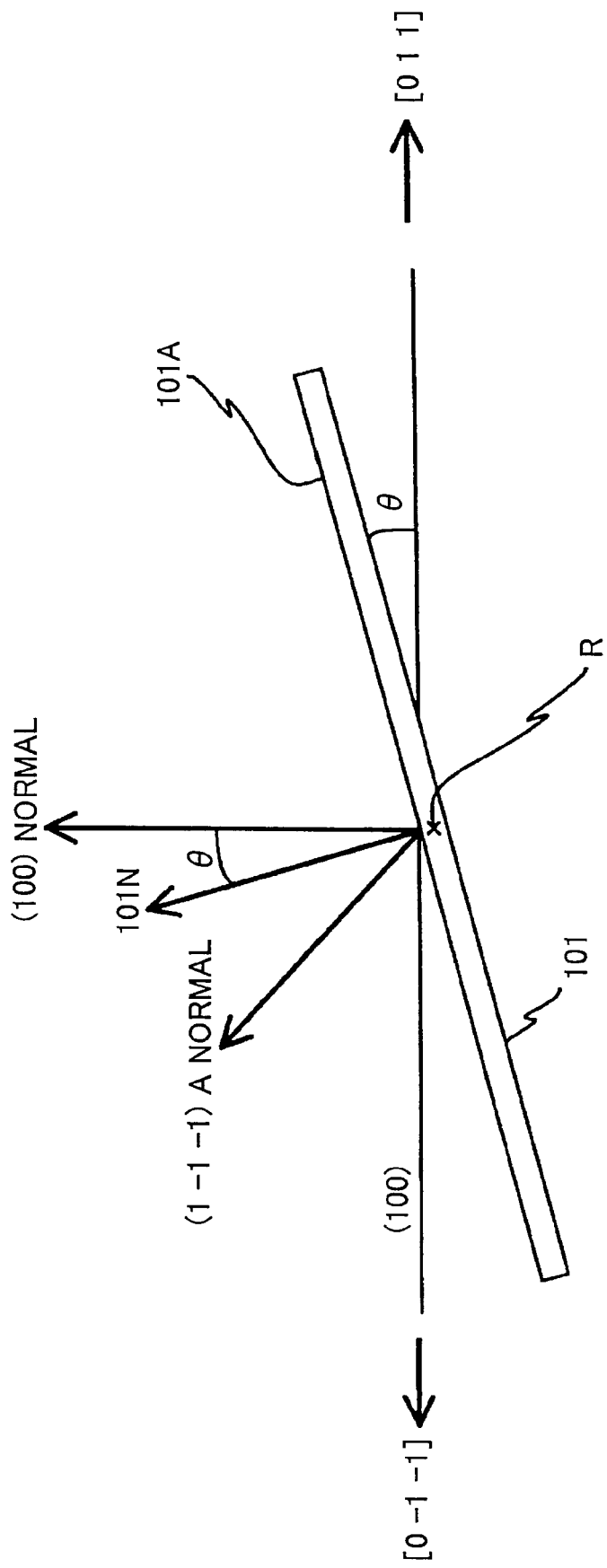

SURFACE-EMISSION LASER DIODE, SURFACE-EMISSION LASER DIODE ARRAY, OPTICAL SCANNING APPARATUS AND IMAGE FORMING APPARATUS

TECHNICAL FIELD

The present invention generally relates to surface-emission laser diodes, surface-emission laser diode arrays, optical scanning apparatuses and image forming apparatuses. More particularly, the present invention relates to a surface-emission laser diode of vertical-cavity surface-emission laser structure emitting light in a direction perpendicular to a substrate, a surface-emission laser diode array including such surface-emission laser diodes with plural numbers, and an optical scanning apparatus and image forming apparatus that use the light produced by such surface-emission laser diode or surface-emission laser diode array.

BACKGROUND ART

A surface-emission laser diode of vertical-cavity surface-emission laser (VCSEL) structure is a laser diode that emits light in a direction perpendicular to a substrate and draws attention these days in view of its advantageous features of low cost, low power consumption and compact size as compared with the laser diode of edge-emission structure that emits light in a direction parallel to the substrate. Further, such a surface-emission laser diode of VCSEL structure has high performance and is suitable for constructing a two-dimensional device.

The laser diode of VCSEL structure can be used for example for the optical source used for optical writing in printers, or the like, the optical source used for optical writing in optical disk apparatuses (oscillation wavelength: 780 nm; 850 nm), and the optical source for optical transmission systems such as LAN (local area network) that uses optical fibers (oscillation wavelength: 1.3 µm; 1.5 µm). Further, it is thought promising to use such a surface-emission laser diode for the optical source of optical transmission between circuit boards, between devices inside a circuit board, between chips forming an LSI (large-scale integrated circuit), and between the device elements inside an LSI.

In the application area of such VCSELs, there frequently arises the demand that the output light thereof forms the light of single fundamental mode and has a constant polarization mode. For example, it is desired to use an optical source of single wavelength and constant polarization mode in optical writing systems, in which there is a need for precise and complex control of optical path for focusing the output optical beam. Further, in the case of optical transmission systems, too, it is preferable to use an optical source of single wavelength and constant polarization mode for transmitting signals over long distance with low noise while suppressing mode competition.

Patent Reference 1 discloses a VCSEL having a fixed polarization direction. Further, Patent Reference 2 discloses a surface-emission laser diode capable of controlling the polarization direction of the laser light reproducibly in a specific direction. Further, Patent Reference 3 discloses a surface-emission laser diode in which two or more peripheral high-resistance layers are interposed between a first reflection mirror and a second reflection mirror with respective, different proportions of resistance increase. Further, Non-Patent Reference 1 discloses generation of optical gain anisotropy by using an inclined substrate.

Patent Reference 1 Japanese Laid-Open Patent Application 9-172218
Patent Reference 2 Japanese Laid-Open Patent Application 2006-13366
Patent Reference 3 Japanese Laid-Open Patent Application 11-307882
Non-Patent Reference 1 Iga, K., Koyama, F. (ed.) Fundamentals and Application of Surface-emission Laser, (in Japanese) Kyoritsu Publishing K.K.

SUMMARY

In an aspect of this disclosure, there is provided a surface-emission laser diode having stabilized polarization mode without inviting increase of cost.

In another aspect, there is provided a surface-emission laser diode array having a uniform polarization mode for each of surface-emission lasers therein without inviting increase of cost.

In another aspect, there is provided an optical scanning apparatus capable of scanning a surface with improved stability.

In another aspect, there is provided an image forming apparatus capable of forming high-definition images with improved stability.

In another aspect, there is provided a surface-emission laser diode of a vertical-cavity surface-emission laser structure formed on a substrate and having a mesa structure including therein a conductive current confinement region formed by selective oxidation of an oxidizable layer, which oxidizable layer being a layer capable of being oxidized, wherein a center of said current confinement region is displaced from a center of said mesa structure with regard to laser oscillation direction.

In the aforementioned structure, there is induced anisotropy in the optical properties of the optical cavity formed in the mesa structure and the polarization plane of electric field is stabilized for the oscillation light. Thereby, it becomes possible to stabilize the polarization mode of the laser diode.

In another aspect, there is provided a surface-emission laser diode array including therein a plurality of the aforementioned surface-emission lasers.

In the aforementioned devices in which there are provided the surface-emission laser diodes as set forth before in plural numbers, it becomes possible to align the polarization mode throughout the surface-emission laser diodes in the array.

In another aspect, there is provided an optical scanning apparatus scanning a surface with an optical beam, comprising: an optical source unit including therein the source-emission laser diode as set forth before in the first aspect, said optical source unit producing an optical beam from a laser light formed with said surface-emission laser diode; a deflection unit deflecting the optical beam from the optical source unit; and a scanning apparatus focusing the optical beam deflected by the deflection unit upon a scanning surface.

In another aspect, there is provided an optical scanning apparatus scanning a surface with a plurality of optical beams, comprising: an optical source unit including therein the source-emission laser diode array as set forth before in the second aspect of the present invention, said optical source unit producing a plurality of optical beams from laser lights formed with said surface-emission laser diode array; a deflection unit deflecting the optical beams from the optical source unit; and a scanning apparatus focusing the optical beams deflected by the deflection unit upon a scanning surface.

In another aspect, there is provided an image forming apparatus, comprising: at least one image carrier body; at least one optical scanning apparatus as set forth in the third aspect of the present invention, the optical scanning apparatus scanning the at least one image carrier body with an optical beam including therein image information; and image transfer means transferring the image formed on the image carrier body upon an object to be transferred with the image.

In another aspect, there is provided an image forming apparatus, comprising: at least one image carrier body; at least one optical scanning apparatus as set forth in the fourth aspect of the present invention, the optical scanning apparatus scanning the at least one image carrier body with a plurality of optical beams each including therein image information; and image transfer means transferring the images formed on one or more image carrier bodies upon an object to be transferred with the images.

In another aspect, there is provided an image forming apparatus that forms an image on an object with an optical beam, wherein the surface-emission laser diode as set forth in the first aspect of the present invention is used for emitting the foregoing optical beam.

In another aspect, there is provided an image forming apparatus that forms an image on an object with a plurality of optical beams, wherein the surface-emission laser diode array as set forth in the second aspect of the present invention is used for emitting the foregoing optical beams.

BRIEF DESCRIPTION OF THE DRAWINGS

FIG. 2 is a diagram for explaining an inclined substrate in which a nominal direction of a mirror polished surface is inclined toward a [111]A crystal orientation direction with regard to a [111] crystal orientation direction.

FIG. 3 is a diagram for explaining the oxidation apparatus used for selective oxidation of a selectively oxidized layer;

FIG. 5 is a diagram for explaining the relationship between the oxidation rate of the selectively oxidized layer and the in-plane orientation;

FIG. 9 is a diagram for explaining an inclined substrate in which a nominal direction of a mirror polished surface is inclined toward a [1-1-1]A crystal orientation with regard to a [111] crystal orientation;

BEST MODE FOR IMPLEMENTING THE INVENTION

First Embodiment

Figure 1:
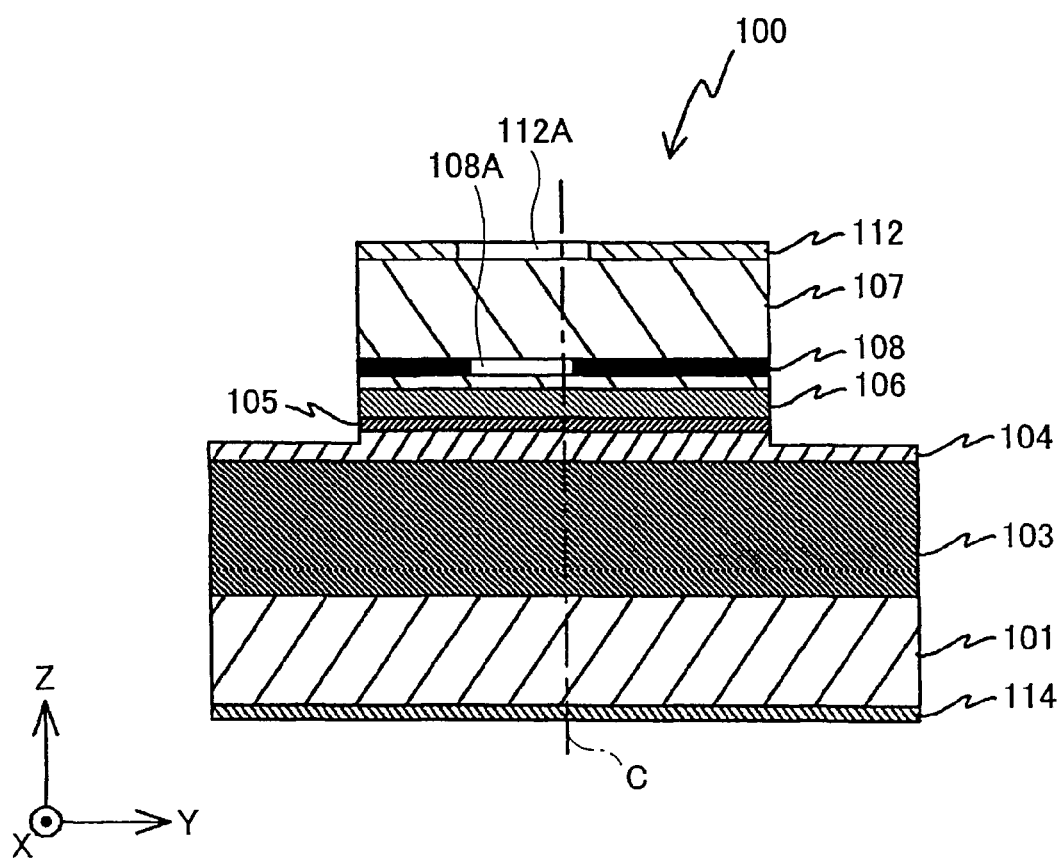
FIG. 1 is a diagram for explaining the general construction of a surface-emission laser diode according to a first embodiment of the present invention.

Hereinafter, a first embodiment of the present invention will be described with reference to FIGS. 1 through 11. FIG. 1 shows the schematic construction of a surface-emission laser diode 100 of vertical-cavity surface-emission laser structure according to a first embodiment of the present invention. In the present invention, explanation will be made based on the coordinate system in which Z-axis is chosen in the laser oscillation direction and X and Y-axes are chosen to form a plane perpendicular to the Z-axis with mutually perpendicular relationship.

Referring to FIG. 1, the surface-emission laser diode 100 is a laser of 850 nm band and is formed on a substrate 101 by stacking consecutively a lower semiconductor DBR (distributed Bragg reflector) 103, a lower spacer layer 104, an active layer 105, an upper spacer layer 106, and an upper semiconductor DBR 107, by using an epitaxial growth process. For the sake of convenience, the part formed as a result of lamination of these semiconductor layers will be designated as "first stacking body".

The substrate 101 has a mirror polished surface 101A. As shown in FIG. 2, the substrate 101 is an n-GaAs monocrystalline substrate having a normal direction 101N of the mirror polished surface 101A inclined by 15 degrees ($\theta=15°$) with regard to the [100] crystal orientation in the direction toward the [111]A crystal orientation. Thus, the substrate 101 is an inclined substrate.

The lower semiconductor DBR 103 includes low-refractive index layers and high-refractive index layers in the form of 42.5 pairs, wherein each pair includes therein a low-refractive index layer of n-$Al_{0.9}Ga_{0.1}As$ and a high-refractive index layer of n-$Al_{0.3}Ga_{0.7}As$.

The lower spacer layer 104 is a layer formed of $Al_{0.5}Ga_{0.5}As$.

The active layer 105 has a triple quantum well structure of GaAs/$Al_{0.5}Ga_{0.5}As$.

The upper spacer layer 106 is a layer formed of $Al_{0.5}Ga_{0.5}As$.

The upper semiconductor DBR 107 includes low-refractive index layers and high-refractive index layers in the form of 32 pairs, wherein each pair includes therein a low-refractive index layer of p-$Al_{0.9}Ga_{0.1}As$ and a high-refractive index layer of n-$Al_{0.3}Ga_{0.7}As$.

Thereby, the selective oxidation layer 108 is inserted into the low-refractive index layer of the upper semiconductor DBR 107 at the location of the second pair as counted from the upper space layer 106 with a thickness of 20 nm.

<<Manufacturing Method>>

Next, manufacturing method of the surface-emission laser diode 100 will be explained briefly.

(1) First, the first stacking body is formed by a crystal growth process conducted by molecular beam epitaxy (MBE) growth process.

(2) Next, a circular resist pattern of a diameter of 20 μm is formed on the surface of the first stacking body.

(3) Next, a mesa structure is formed in the form of circular pillar by an ECR (electron-cyclotron resonance) etching process that uses a $Cl_2$ gas while using the circular resist pattern as a mask. Here, the etching process is controlled such that the bottom of the etching is located in the lower spacer layer 104.

(4) After removing the resist pattern, the first stacking body thus formed with the mesa structure is set in an oxidation apparatus 1000, an example of which is shown in FIG. 3, and the selective oxidation process of the selectively oxidized layer 108 is conducted.

It should be noted that this oxidation apparatus 1000 includes a water vapor supplying part 1010, a stainless steel reaction vessel 1020, an inlet line 1030, an exhaust line 1040, a water collector 1050, temperature controller (not shown), and the like. The water vapor supplying part includes a mass flow controller 1011, a vaporizer 1012, a liquid mass flow controller 1013, and a water supplying unit 1014. Further, the stainless steel reaction vessel 1020 accommodates therein: a tray 1021 on which an object 1060 to be processed is placed; a circular heating table 1022 including therein a ceramic heater 1024 for heating the object 1060 via the tray 1021; a thermocouple 1025 for measuring the temperature of the object 1060; and a rotatable base 1023 holding the heating table 1022.

The temperature controller controls the current (or voltage) supplied to the ceramic heater 1024 while monitoring the output signal of the thermocouple 1025 and holds the object 1060 at a prescribed temperature (holding temperature) for a prescribed duration (holding time).

Next, operation of the water vapor supplying part 1010 will be explained briefly. Upon introduction of a nitrogen gas ($N_2$) into the water vapor supplying part 1014, water ($H_2O$) is supplied to the vaporizer 1012 with a controlled flow rate via the liquid mass flow controller 1013 and water vapor is generated. Further, when an $N_2$ carrier gas is introduced, the $N_2$ carrier gas is supplied to the vaporizer with a flow rate controlled by the mass flow controller 1011. Further, an $N_2$ carrier gas containing water vapor is supplied from the vaporizer 1012 into the stainless reaction vessel 1020 via the inlet line 1030.

The $N_2$ carrier gas containing water vapor thus supplied to the stainless reaction vessel 1020 is supplied to the region surrounding the object 1060 to be oxidized. With this, the object 1060 for oxidation is exposed to the water vapor ambient and there is caused oxidation in the object 1060. Thereafter, the $N_2$ carrier gas containing water vapor is evacuated via the exhaust line 1040 and the water collection unit 1050.

Figure 4A:
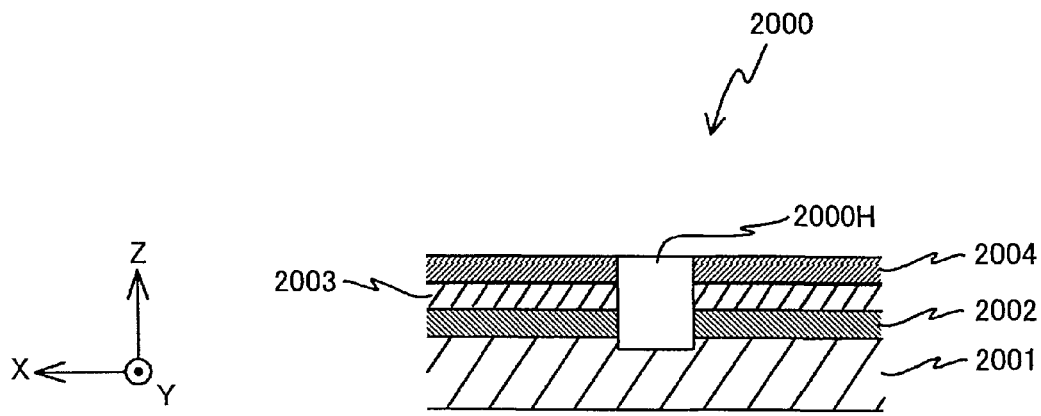
FIGS. 4A and 4B are diagrams respectively explaining the specimen used for obtaining in-plane orientation dependence of oxidation rate of the selectively oxidized layer.
Figure 4B:
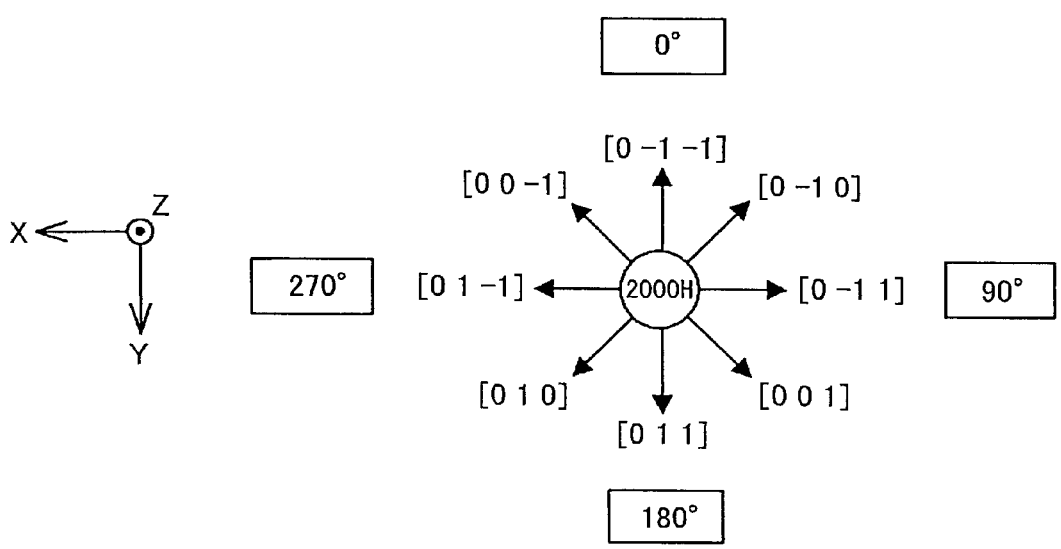

Meanwhile, FIG. 5 shows the relationship between the oxidation rate and in-plane orientation of a specimen 2000 in the oxidizing apparatus 1000 at the time of oxidizing the specimen 2000 as the oxidation object 1060, wherein the specimen 2000 has a structure of consecutively stacking, on a substrate 2001 of GaAs having a mirror polished surface and inclined by 15° from the [100] crystal orientation toward the [111]A crystal orientation, a GaAs layer 2002, an AlAs layer 2003 of 20 nm thickness and a GaAs layer 2004 with an epitaxial growth process. Further, the specimen 2000 is formed with a hole 2000H of a diameter of 5 μm by way of a dry etching process. It should be noted that FIG. 4A shows the relationship between the oxidation rate of the AlAs layer 2003 and the in-plane orientation. The water flow rate is set to 80 g/hr, while the $N_2$ carrier gas is supplied with the flow rate of 20 SLM. In FIG. 5, the crystal orientation is defined in conformity with the definition of FIG. 4B, and thus, the [0-1-1] orientation is defined as 0°, the [0-11] orientation is defined as 90°, and the [011] orientation is defined as 180°. In FIG. 5, it should be noted that the oxidation rate for the in-plane orientation of 90° is defined as 1 and the oxidation rates for other crystal orientations are normalized to this oxidation rate for the in-plane orientation of 90°.

Figure 6A:
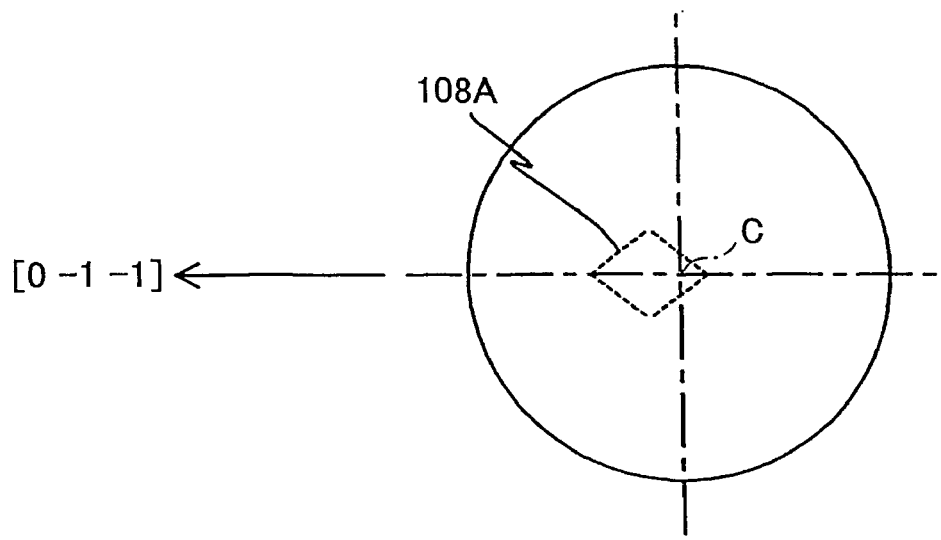
FIGS. 6A and 6B are diagrams for explaining a deviation of location of the conductive current confinement region.
Figure 6B:
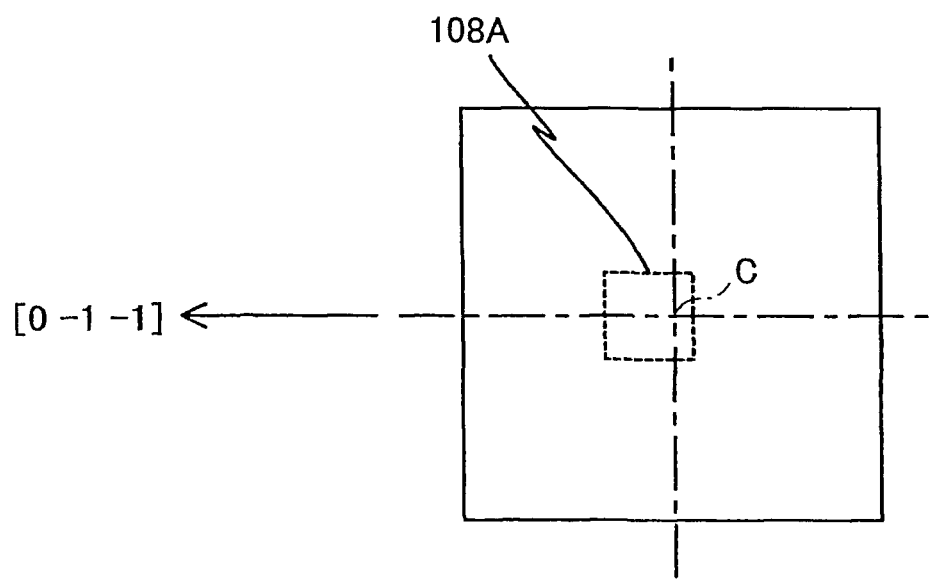

Thus, when oxidation is made for the specimen formed on the substrate of GaAs having a mirror polished surface 101A of which normal direction 101N is inclined by 15° from the [100] orientation in the direction toward the [111]A orientation and a plurality of semiconductor layers including the AlAs layer 108 of the thickness of 20 nm are stacked thereon, the specimen further being formed with a mesa structure of circular pillar form by an etching process, it was observed that there is formed a conductive current confinement region 108A of rhombic shape having an edge length of about 4 μm at a location offset at the center thereof from the center C of the mesa structure by about 2 μm in the [0-1-1] direction as shown in FIG. 6A, wherein the oxidation was conducted at the holding temperature of 410° C. for the holding duration of 11.3 minutes while supplying water with the flow rate of 80 g/hr and the $N_2$ carrier gas with the flow rate of 20 SLM. Further, when a specimen formed similarly except that there is formed a rectangular mesa structure is subjected to the oxidation process under the condition of the holding temperature of 360° C. and the holding duration of 42.5 minutes while supplying water with the flow rate of 80 g/hr and the $N_2$ carrier gas with the flow rate of 20 SLM, it was observed that there is formed a conductive current confinement region 108A of rectangular shape with an edge length of 4 μm with offset at the center thereof from the center C of the mesa structure in the direction of the [0-1-1] orientation by about 2 μm as shown in FIG. 6B.

Thus, with the first embodiment of the present invention, the first stacking body thus processed and formed with the mesa structure is subjected to the oxidation process under the condition (oxidation condition) of the water flow rate of 80 g/hr, the $N_2$ carrier gas flow rate of 20 SLM, the holding temperature of 410° C., and the holding duration of 11.3 minutes.

Figure 7A:
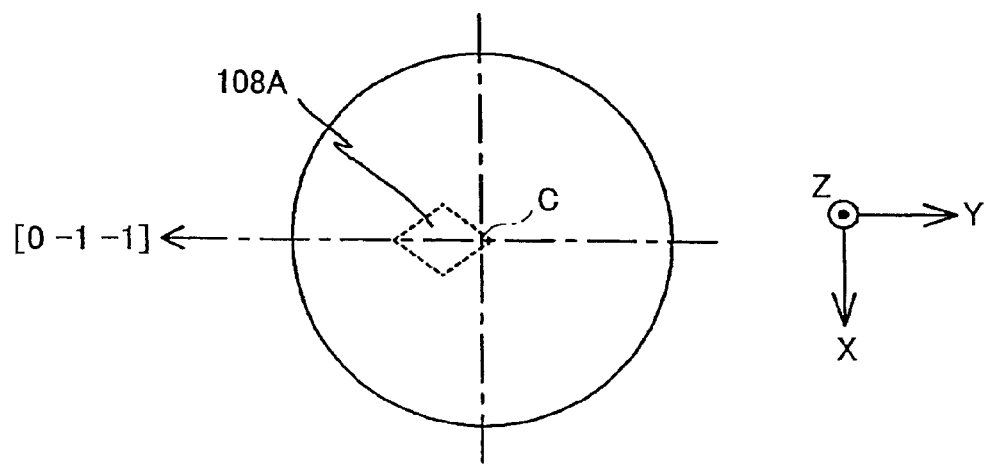
FIGS. 7A and 7B are diagrams for explaining the conductive current confinement region after the selective oxidation processing.
Figure 7B:
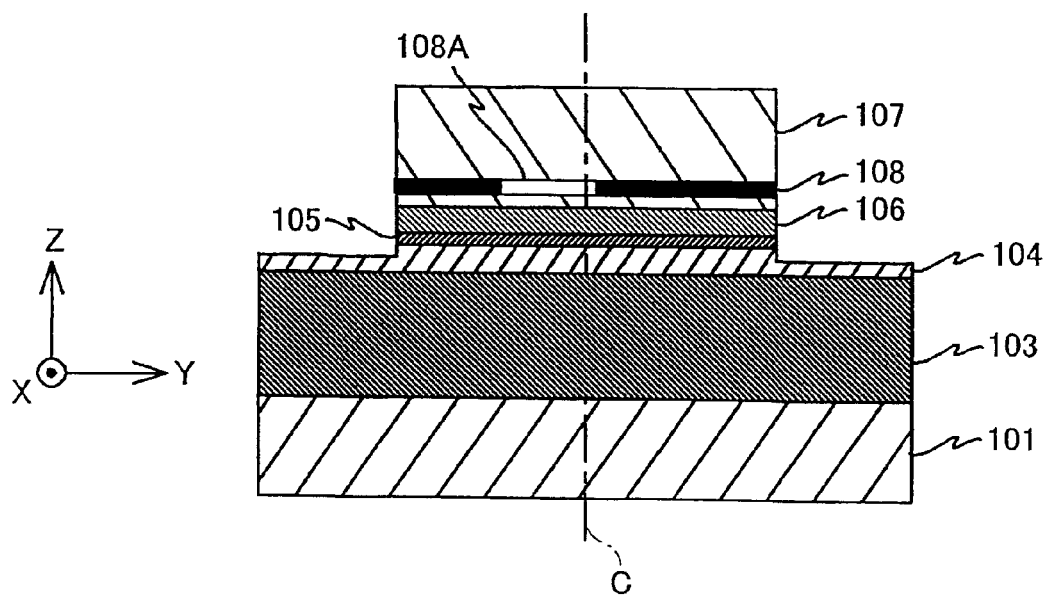

After the selective oxidation process, it was observed, with microscopic examination of the selectively oxidized layer 108 by using an infrared microscope, that there is formed a conductive current confinement region 108A of rhombic shape defined with edges having an edge length of about 4 μm and forming an angle of 35-50° with regard to the [0-1-1] orientation, an example of which is shown in FIG. 7A. Further, as shown in FIGS. 7A and 7B, it was observed that the center of the conductive current confinement region 108A is displaced from the center C of the mesa structure by about 2 μm in the [0-1-1] direction with regard to the laser oscillation direction (Z-axis direction), and hence in the plane perpendicular to the Z-axis direction. This appearance of offset reflects the situation that, with the selectively oxidized layer 108, there appears much larger oxidation rate in the crystal orientations of [0-10], [001], [00-1] and [010] as compared with other crystal orientations and that the oxidation condition was selected such that the oxidation rate in the crystal orientations of [0-10] and [00-1] becomes larger than the oxidation rate in the crystal orientations of [001] and [010].

(5) Next, an insulating protective layer (not shown) of polyimide is formed around the mesa structure.

(6) Next, an upper electrode 112 having an aperture 112A for optical output is formed such that the center of the aperture 112A coincides with the center of the conductive current confinement region 108A with regard to the laser oscillation direction (Z-axis direction, and hence in the plane perpendicular to the Z-axis direction.

(7) Further, a lower electrode 114 is provided on the bottom surface of the substrate 101.

Figure 8A:
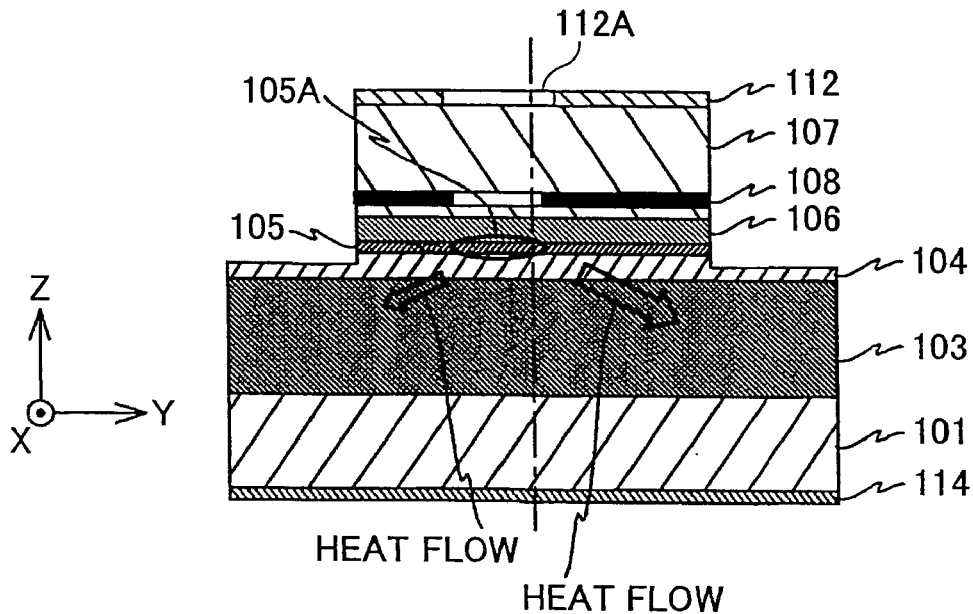
FIGS. 8A and 8B are diagrams for explaining the optical anisotropy of optical cavity for the surface-emission laser diode of FIG. 1.

Thus, as explained heretofore, the surface-emission laser diode 100 of the first embodiment has the feature that the center of the conductive current confinement region 108A is displaced from the center C of the mesa structure with regard to the laser oscillation direction (Z-axis direction), in other words, in the plane perpendicular to the Z-axis direction. With this, there is induced anisotropy in the thermal conduction at the time of heat radiation from a heat generation region 105A located in the active layer 105 in the vicinity of the conductive current confinement region as shown in FIG. 8A.

Figure 8B:
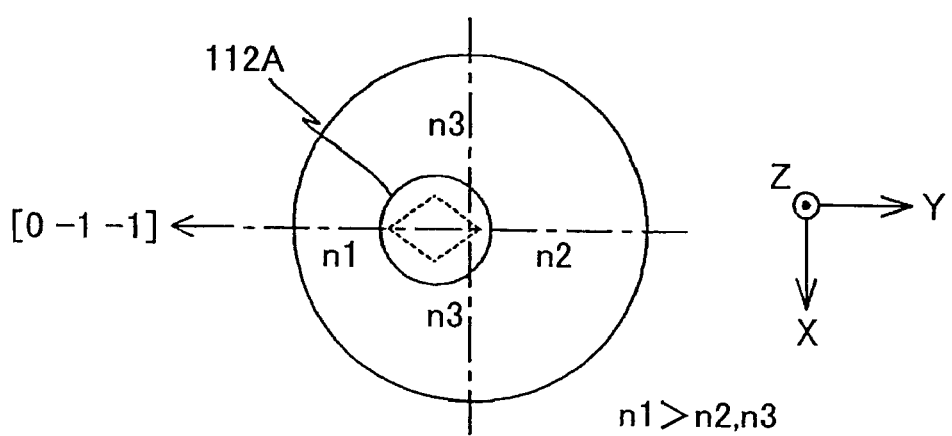
Figure 10:
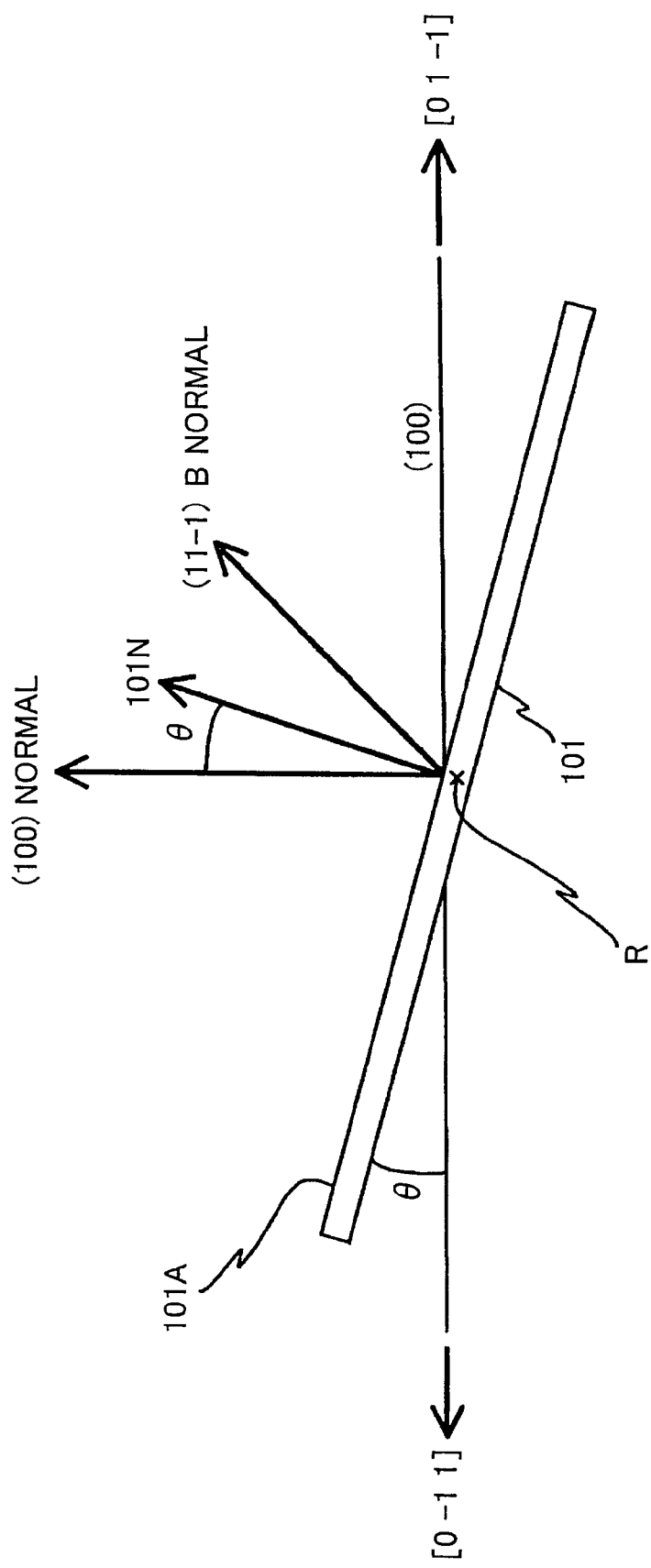
FIG. 10 is a diagram for explaining an inclined substrate in which a nominal direction of a mirror polished surface is inclined toward a [11-1]B crystal orientation with regard to a [111] crystal orientation direction.
Figure 11:
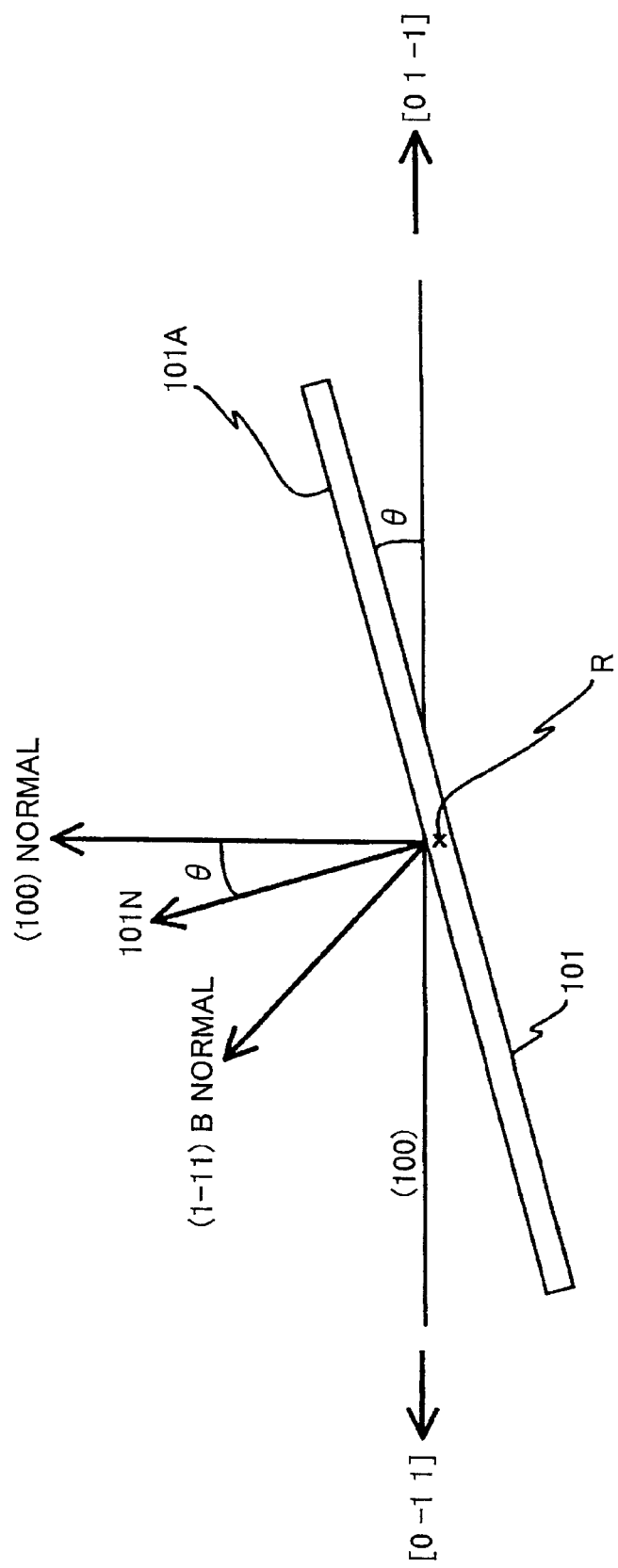
FIG. 11 is a diagram for explaining an inclined substrate in which a nominal direction of a mirror polished surface is inclined toward a [1-11]B crystal orientation with regard to a [111] crystal orientation.

More specifically, there occurs a decrease of thermal conductivity in the direction in which the distance to the mesa edge is small (−Y direction in FIG. 8A), resulting in increase of temperature in such a region 105A. As a result, there is caused increase of refractive index n1 with such a region between the heat generation region 105A and the mesa edge as compared with the refractive indices n2 and n3 of other regions, as shown in FIG. 8B. Thereby, there is induced optical anisotropy in the optical cavity, resulting in loss of optical symmetry for the optical cavity. Thus, while the optical properties may be identical and symmetric in the +X side of the heat generating region and in −X side of the heat generating region, the optical properties are no longer identical and symmetric in the +Y side of the heat generating region and in the −Y side of the heat generating region. With this anisotropy, the polarization plane of electric field of oscillation light is stabilized and it becomes possible to set the polarization direction of the laser light to be coincident to the [0-1-1] direction.

Further, according to the surface-emission laser diode 100 of the first embodiment, there is attained anisotropy of optical gain in the active layer 105 as a result of use of inclined substrate for the substrate 101, and it becomes possible to further stabilize the polarization plane of the electric field of the oscillation light.

Further, according to the surface-emission laser diode 100 of the first embodiment, it should be noted that the center of the aperture 112A of the upper electrode 112 is coincident to the center of the conductive current confinement region 108A with regard to the laser oscillation direction. With this, scattering of the oscillation light with the aperture edge of the upper electrode 112 is eliminated and it becomes possible to obtain stable optical output.

It should be noted that there are numerous modes of substrate inclination for obtaining anisotropy of oxidation rate in the selectively oxidized layer 108. For the purpose of offsetting the center of the conductive current confinement region 108A in the direction perpendicular to a rotational axis R, about which the inclination of the substrate 101 is caused, any of the two cases are advantageous: the case in which the direction of the rotational axis R for causing inclination is coincident to the [01-1] direction and the [0-11] direction (see FIGS. 2 and 9); and the case in which the direction of the rotational axis R for causing inclination is coincident to the [0-1-1] direction and the [011] direction (see FIGS. 10 and 11). In any of these cases, it is possible to displace the center of the current confinement region 108A from the center C of the mesa structure as a result of anisotropy of oxidation rate in the direction perpendicular to the rotational axis R for causing the inclination in the substrate surface.

Second Embodiment

Figure 12:
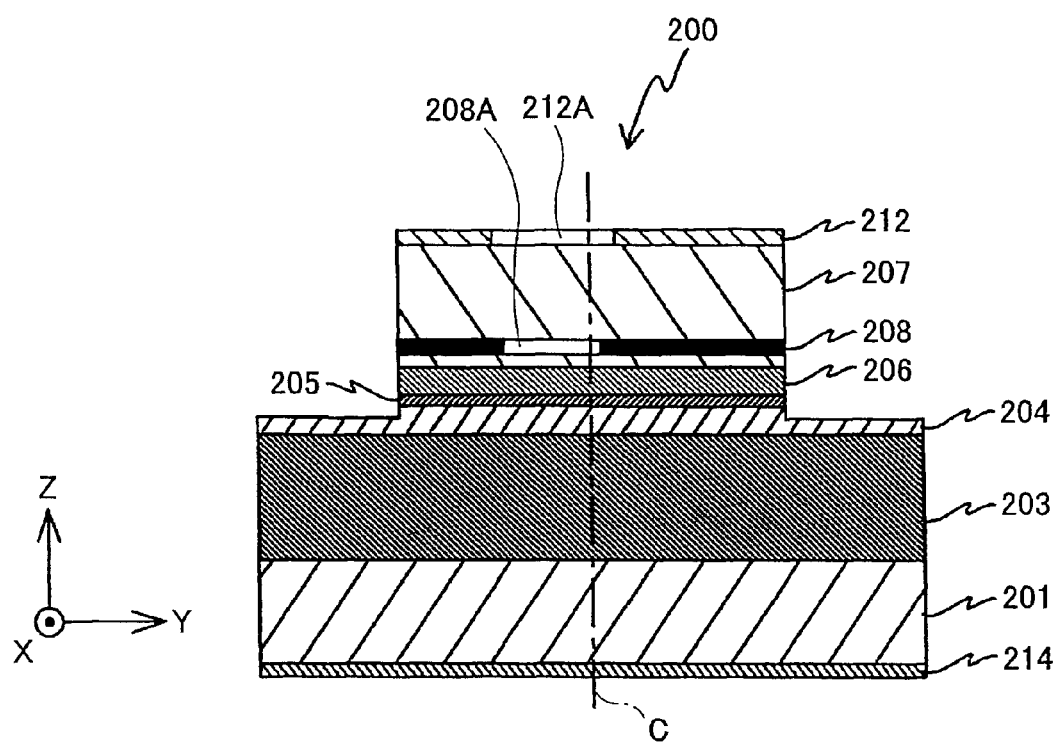
FIG. 12 is a diagram for explaining the general construction of a surface-emission laser diode according to a second embodiment of the present invention.

Hereinafter, a second embodiment of the present invention will be described with reference to FIGS. 12 through 13B. FIG. 12 shows the schematic construction of a surface-emission laser diode 200 of vertical-cavity surface-emission laser structure according to a second embodiment of the present invention.

Referring to FIG. 12, the surface-emission laser diode 200 is a laser of 780 nm band and is formed on a substrate 201 by stacking consecutively a lower semiconductor DBR 203, a lower spacer layer 204, an active layer 205, an upper spacer layer 206, and an upper semiconductor DBR 207, by using an epitaxial growth process. For the sake of convenience, the part formed as a result of lamination of these semiconductor layers will be designated as "second stacking body".

The substrate 201 has a mirror polished surface, wherein the substrate 201 is an n-GaAs monocrystalline substrate having a normal direction of the mirror polished surface inclined by 15 degrees with regard to the [100] crystal orientation in the direction toward the [111]A crystal orientation. Thus, the substrate 201 is an inclined substrate.

The lower semiconductor DBR 203 includes low-refractive index layers and high-refractive index layers in the form of 42.5 pairs, wherein each pair includes therein a low-refractive index layer of n-$Al_{0.93}Ga_{0.07}As$ and a high-refractive index layer of n-$Al_{0.3}Ga_{0.7}As$.

The lower spacer layer 204 is a layer formed of $Al_{0.33}Ga_{0.67}As$.

The active layer 205 has a triple quantum well structure of GaInAsP/$Al_{0.33}Ga_{0.67}As$.

The upper spacer layer 206 is a layer formed of $Al_{0.33}Ga_{0.67}As$.

The upper semiconductor DBR 207 includes a low-refractive index layer and a high-refractive index layer in 32 pairs, wherein each pair includes therein a low-refractive index layer of p-$Al_{0.93}Ga_{0.07}As$ and a high-refractive index layer of p-$Al_{0.33}Ga_{0.67}As$.

Thereby, a selective oxidation layer 208 of p-AlAs is inserted into the low-refractive index layer of the upper semiconductor DBR 207 at the location of the second pair as counted from the upper space layer 206 with a thickness of 30 nm.

<<Manufacturing Method>>

Next, manufacturing method of the surface-emission laser diode 200 will be explained briefly.

(1) First, the second stacking body is formed by a crystal growth process conducted by a metal-organic CVD (MOCVD) process.

(2) Next, a rectangular resist pattern of the size of 18 μm×20 μm is formed on the surface of the second stacking body.

(3) Next, a mesa structure is formed in the form of rectangular pillar by an ECR etching process that uses a $Cl_2$ gas while using the rectangular resist pattern as a mask. Here, the etching process is controlled such that the bottom of the etching is located in the lower spacer layer 204.

(4) After removing the resist pattern, the second stacking body thus formed with the mesa structure is set to the oxidation apparatus 1000, and the selective oxidation process of the selectively oxidized layer 208 is conducted. In the present embodiment, an oxidation condition is used such that the water flow rate is set to 100 g/hr, the $N_2$ carrier gas flow rate is 5 SLM, the holding temperature is 360° C., and the holding duration is 38.1 minutes.

Figure 13A:
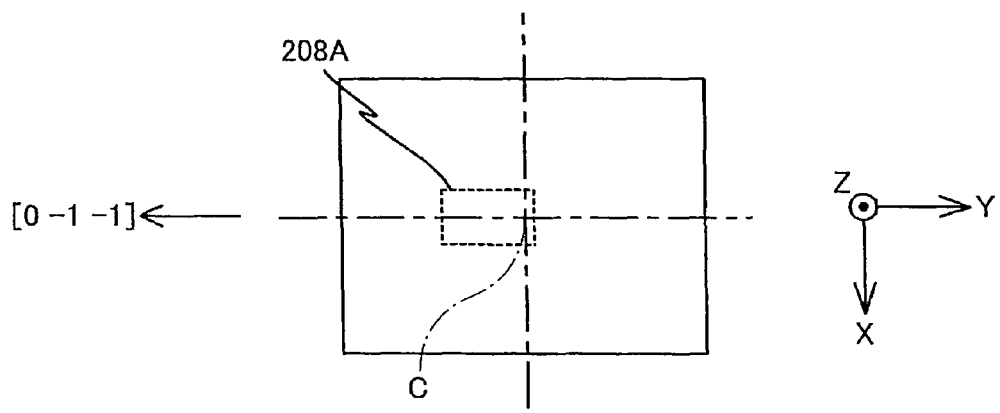
FIGS. 13A and 13B are diagrams for explaining the conductive current confinement region after the selective oxidation processing.
Figure 13B:
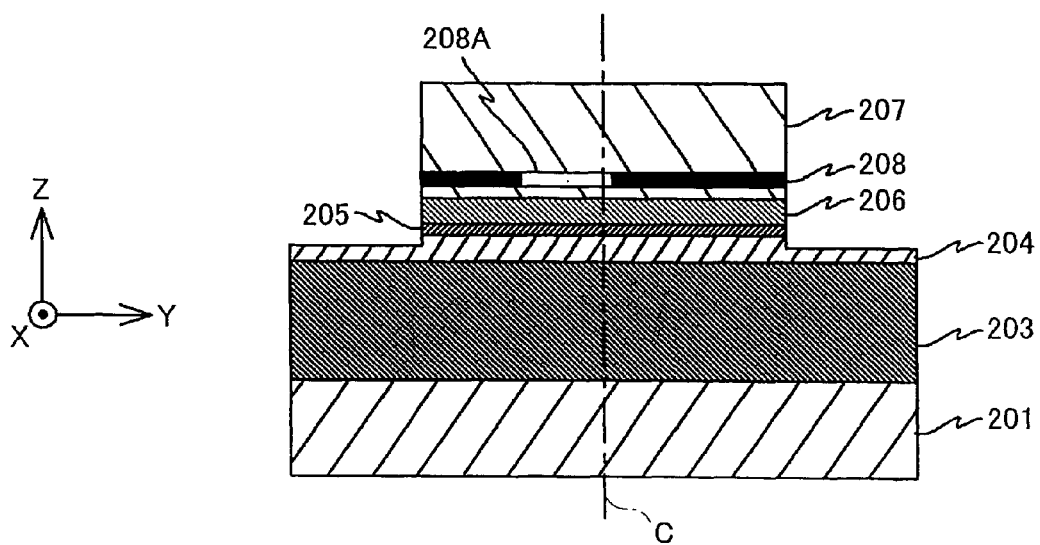

After the selective oxidation process, the selectively oxidized layer 208 was examined with an infrared microscope, and it was observed that there is formed a rectangular conductive current confinement region 208A of the shape of 3 μm×4 μm as shown in FIG. 13A. Further, as shown in FIGS. 13A and 13B, it was observed that the center of the conductive current confinement region 208A was displaced from the center C of the mesa structure by about 2 μm in the [0-1-1] direction with regard to the laser oscillation direction. It should be noted that this reflects the situation of choosing, in the selectively oxidized layer 208, the oxidation condition to satisfy the relationship of: (oxidation rate in [0-1-1] direction)>(oxidation rate in [0-11] direction); and (oxidation rate in [01-1] direction)>(oxidation rate in [011] direction).

(5) Next, an insulating protective layer (not shown) of polyimide is formed around the mesa structure.

(6) Next, an upper electrode 212 having an aperture 212A for optical output is formed such that the center of the aperture coincides with the center of the conductive current confinement region 208A with regard to the laser oscillation direction (Z-axis direction), and hence in the plane perpendicular to the Z-axis.

(7) Further, a lower electrode 214 is provided on the bottom surface of the substrate 201.

As explained heretofore, the polarization plane of electric field of the oscillation light is stabilized similarly to the case of the surface-emission laser diode 100 of the first embodiment also with the surface-emission laser diode 200 of the second embodiment because of the displacement of the center of the conductive current confinement region 208A from the center C of the mesa structure with regard to the laser oscillation direction (Z-axis direction), and hence in the plane perpendicular to the Z-axis direction, and it becomes possible to set the polarization direction of the laser light to be coincident to the [0-1-1] direction.

Further, according to the surface-emission laser diode 200 of the second embodiment, there is attained anisotropy of optical gain in the active layer 205 as a result of use of inclined substrate for the substrate 201, and it becomes possible to further stabilize the polarization plane of the electric field of the oscillation light.

Further, according to the surface-emission laser diode 200 of the second embodiment, it should be noted that the center of the aperture 212A of the upper electrode 212 is coincident to the center of the conductive current confinement region 208A with regard to the laser oscillation direction. With this, scattering of the oscillation light with the aperture edge of the upper electrode 212 is eliminated and it becomes possible to obtain stable optical output.

Third Embodiment

Figure 14:
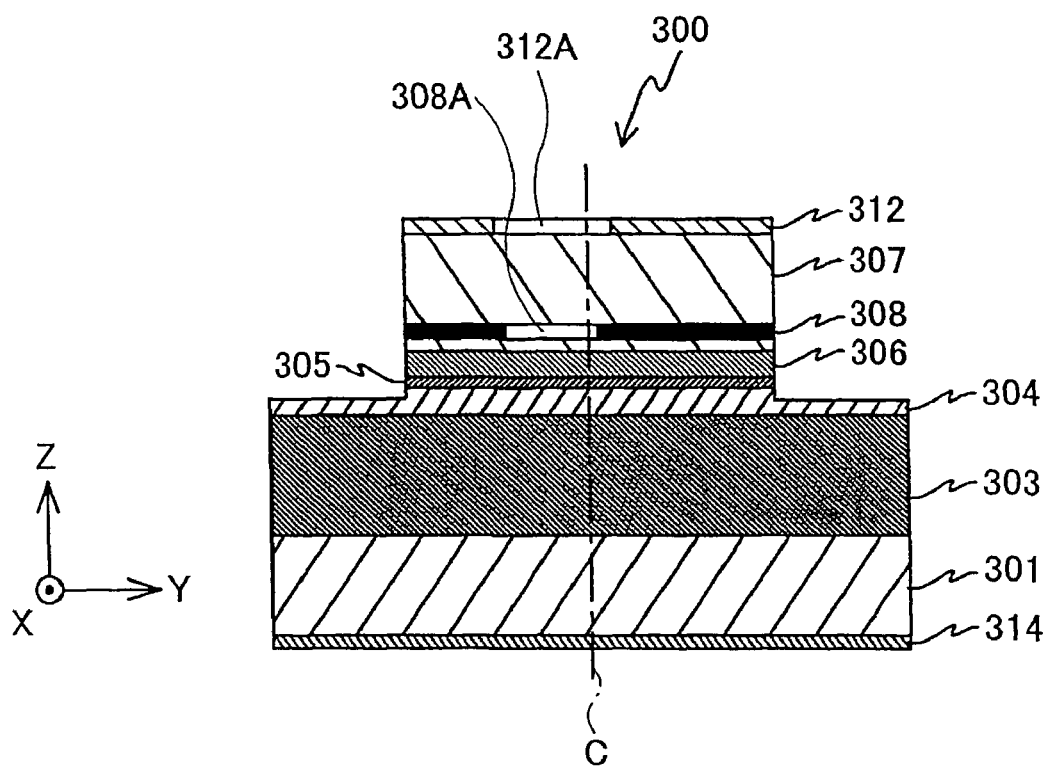
FIG. 14 is a diagram for explaining the general construction of a surface-emission laser diode according to a third embodiment of the present invention.

Hereinafter, a third embodiment of the present invention will be described with reference to FIGS. 14 through 15B. FIG. 14 shows the schematic construction of a surface-emission laser diode 300 of vertical-cavity surface-emission laser structure according to a third embodiment of the present invention.

Referring to FIG. 14, the surface-emission laser diode 300 is a laser of 980 nm band and is formed on a substrate 301 by stacking consecutively a lower semiconductor DBR 303, a lower spacer layer 304, an active layer 305, an upper spacer layer 306, and an upper semiconductor DBR 307, by using an epitaxial growth process. For the sake of convenience, the part formed as a result of lamination of these semiconductor layers will be designated as "third stacking body".

The substrate 301 has a mirror polished surface, wherein the substrate 301 is an n-GaAs monocrystalline substrate having a normal direction of the mirror polished surface inclined by 10 degrees with regard to the [100] crystal orientation in the direction toward the [111]A crystal orientation. Thus, the substrate 301 is an inclined substrate.

The lower semiconductor DBR 303 includes low-refractive index layers and high-refractive index layers in the form of 38.5 pairs, wherein each pair includes therein a low-refractive index layer of n-$Al_{0.9}Ga_{0.1}As$ and a high-refractive index layer of n-GaAs.

The lower space layer 304 is a layer formed of GaAs.

The active layer 305 is an active layer of GaInAs/GaAs TQW (triple quantum well) structure.

The upper space layer 306 is a layer formed of GaAs.

The upper semiconductor DBR 307 includes low-refractive index layers and high-refractive index layers in the form of 30 pairs, wherein each pair includes therein a low-refractive index layer of p-$Al_{0.9}Ga_{0.1}As$ and a high-refractive index layer of p-GaAs.

Thereby, a selective oxidation layer 308 of p-AlAs is inserted into the low-refractive index layer of the upper semiconductor DBR 307 at the location of the second pair as counted from the upper space layer 306 with a thickness of 30 nm.

<<Manufacturing Method>>

Next, manufacturing method of the surface-emission laser diode 300 will be explained briefly.

(1) First, the third stacking body is formed by a crystal growth process conducted by a metal-organic CVD (MOCVD) process.

(2) Next, a square resist patter of the size of 20 μm×20 μm is formed on the surface of the third stacking body.

(3) Next, a mesa structure is formed in the form of rectangular pillar by an ECR etching process that uses a $Cl_2$ gas while using the square resist pattern as a mask. Here, the etching process is controlled such that the bottom of the etching is located in the lower spacer layer 304.

(4) After removing the resist pattern, the third stacking body thus formed with the mesa structure is set to the oxidation apparatus 1000, and the selective oxidation process of the selectively oxidized layer 308 is conducted. In the present embodiment, an oxidation condition is used such that the water flow rate is set to 100 g/hr, the $N_2$ carrier gas flow rate is 5 SLM, the holding temperature is 350° C., and the holding duration is 47.1 minutes.

Figure 15A:
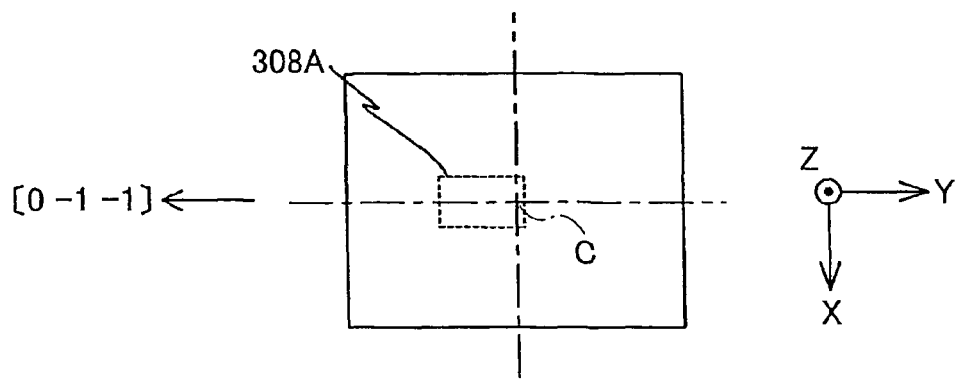
FIGS. 15A and 15B are diagrams for explaining the conductive current confinement region after the selective oxidation processing.
Figure 15B:
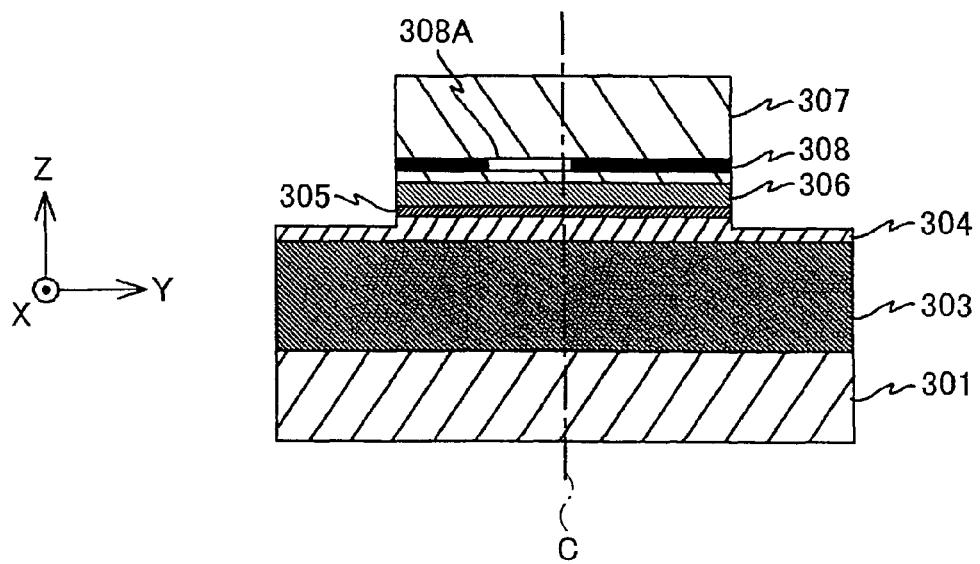

After the selective oxidation process, the selectively oxidized layer 308 was examined with an infrared microscope, and it was observed that there is formed a rectangular conductive current confinement region 308A of the size of 3 μm×4 μm as shown in FIG. 15A. Further, as shown in FIGS. 15A and 15B, it was observed that the center of the conductive current confinement region 308A was displaced from the center C of the mesa structure by about 2 μm in the [0-1-1] direction with regard to the laser oscillation direction (Z-axis direction), in other words, in the plane perpendicular to the Z-axis direction. It should be noted that this reflects the situation of choosing, in the selectively oxidized layer 308, the oxidation condition to satisfy the relationship of: (oxidation rate in [0-1-1] direction)>(oxidation rate in [0-11] direction); and (oxidation rate in [01-1] direction)>(oxidation rate in [011] direction).

(5) Next, an insulating protective layer (not shown) of SiN is formed around the mesa structure.

(6) Next, an upper electrode 312 having an aperture 312A for optical output is formed such that the center of the aperture 312A coincides with the center of the conductive current confinement 308A region with regard to the laser oscillation direction.

(7) Further, a lower electrode 314 is provided on the bottom surface of the substrate 301.

As explained heretofore, the polarization plane of electric field of the oscillation light is stabilized similarly to the case of the surface-emission laser diode 100 of the first embodiment described before also with the surface-emission laser diode 300 of the third embodiment because of the displacement of the center of the conductive current confinement region from the center of the mesa structure with regard to the laser oscillation direction (Z-axis direction), and hence in the plane perpendicular to the Z-axis direction, and it becomes possible to set the polarization direction of the laser light to be coincident to the [0-1-1] direction.

Further, according to the surface-emission laser diode 300 of the third embodiment, there is attained anisotropy of optical gain in the active layer 305 as a result of use of inclined substrate for the substrate 301, and it becomes possible to further stabilize the polarization plane of the electric field of the oscillation light.

Further, according to the surface-emission laser diode 300 of the third embodiment, it should be noted that the center of the aperture 312A of the upper electrode 312 is coincident to the center of the conductive current confinement region 308A with regard to the laser oscillation direction (Z-axis direction). With this, scattering of the oscillation light with the aperture edge of the upper electrode 312 is eliminated and it becomes possible to obtain stable optical output.

Further, while explanation has been made in the first through third embodiments above, with regard to the case of the offset amount of about 2 μm for the center of the conductive current confinement region from the center of the mesa structure with regard to the laser oscillation direction (Z-axis direction), the present invention is by no means limited to such a specific case. In order to induce the desired optical anisotropy in the optical cavity, it is sufficient that the amount of the displacement or offset is 0.5 μm or more (preferably 1 μm or more).

Fourth Embodiment

Figure 16:
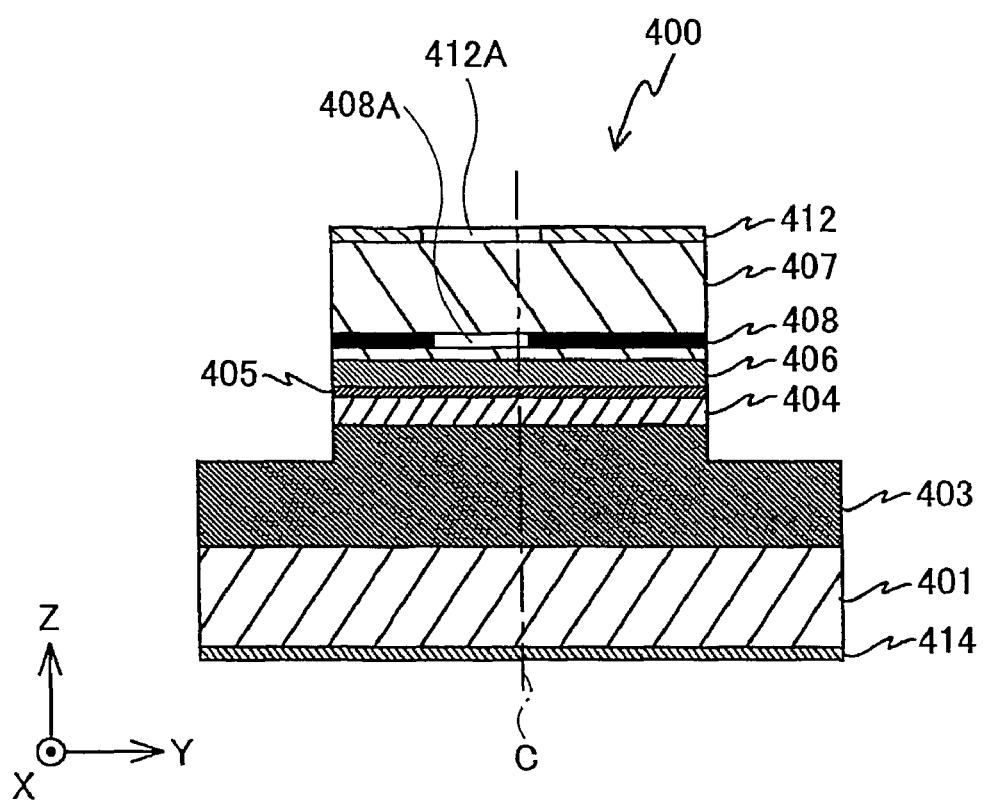
FIG. 16 is a diagram for explaining the general construction of a surface-emission laser diode according to a fourth embodiment of the present invention.

Hereinafter, a fourth embodiment of the present invention will be described with reference to FIGS. 16 through 19B. FIG. 16 shows the schematic construction of a surface-emission laser diode 400 of vertical-cavity surface-emission laser structure according to a fourth embodiment of the present invention.

Referring to FIG. 16, the surface-emission laser diode 400 is a laser of 1.3 μm band and is formed on a substrate 16 by stacking consecutively a lower semiconductor DBR 403, a lower spacer layer 404, an active layer 405, an upper spacer layer 406, and an upper semiconductor DBR 407, by using an epitaxial growth process. For the sake of convenience, the part formed as a result of lamination of these semiconductor layers will be designated as "fourth stacking body".

The substrate 401 has a mirror polished surface, wherein the substrate 401 is an n-GaAs monocrystalline substrate having a normal direction of the mirror polished surface inclined by 5 degrees with regard to the [100] crystal orientation in the direction toward the [111]A crystal orientation. Thus, the substrate 401 is an inclined substrate.

The lower semiconductor DBR 403 includes low-refractive index layers and high-refractive index layers in the form of 35.5 pairs, wherein each pair includes therein a low-refractive index layer of n-$Al_{0.9}Ga_{0.1}As$ and a high-refractive index layer of n-GaAs.

The lower space layer 404 is a layer formed of GaAs.

The active layer 405 is an active layer of GaInAs/GaAs TQW (triple quantum well) structure.

The upper space layer 406 is a layer formed of GaAs.

The upper semiconductor DBR 407 includes low-refractive index layers and high-refractive index layers in the form of 28 pairs, wherein each pair includes therein a low-refractive index layer of p-$Al_{0.9}Ga_{0.1}As$ and a p-GaAs.

Thereby, a selective oxidation layer 408 of p-$Al_{0.98}Ga_{0.02}As$ is inserted into the low-refractive index layer of the upper semiconductor DBR 407 at the location of the second pair as counted from the upper space layer 406 with a thickness of 30 nm.

<<Manufacturing Method>>

Next, manufacturing method of the surface-emission laser diode 400 will be explained briefly.

(1) First, the fourth stacking body is formed by a crystal growth process conducted by a metal-organic CVD (MOCVD) process.

(2) Next, a square resist patter of the size of 30 μm×30 μm is formed on the surface of the fourth stacking body.

(3) Next, a mesa structure is formed in the form of rectangular pillar with center C by an ICP etching process that uses a $Cl_2$ gas while using the square resist pattern as a mask. Here, the etching process is controlled such that the bottom of etching is located at the location of the second pair as counted from the top of the lower semiconductor DBR 403.

(4) After removing the resist pattern, the fourth stacking body thus formed with the mesa structure is set to the oxidation apparatus 1000, and the selective oxidation process of the selectively oxidized layer 408 is conducted. In the present embodiment, an oxidation condition is used such that the water flow rate is set to 200 g/hr, the $N_2$ carrier gas flow rate is 5 SLM, the holding temperature is 430° C., and the holding duration is 21.7 minutes.

Figure 17A:
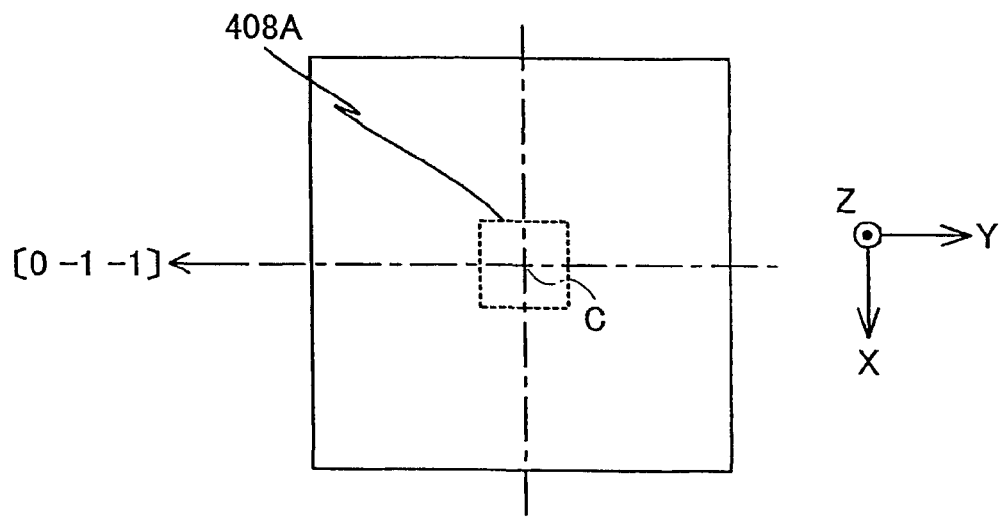
FIGS. 17A and 17B are diagrams for explaining the conductive current confinement region after the selective oxidation processing.
Figure 17B:
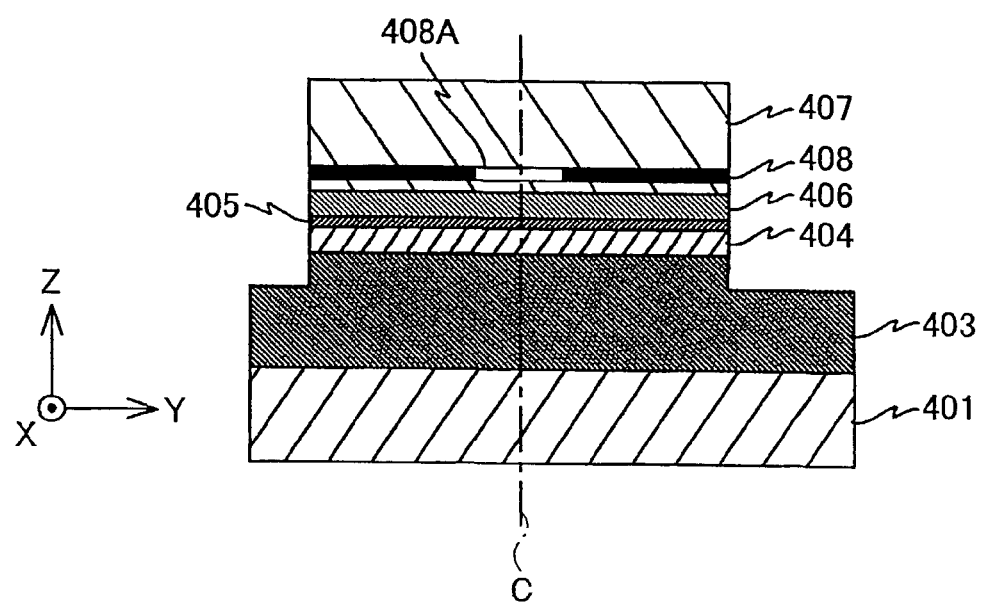

After the selective oxidation process, the selectively oxidized layer 408 was examined with an infrared microscope, and it was observed that there is formed a square conductive current confinement region 408A of the size of 4 μm for each edge, an example of which is shown in FIG. 17A. Further, as shown in FIGS. 17A and 17B, it was confirmed that the center of the conductive current confinement region 408A is coincident to the center C of the mesa structure with regard to the laser oscillation direction (Z-axis direction), and hence in the plane perpendicular to the Z-axis direction. It should be noted that this reflects the situation that the crystal orientation dependence of the oxidation rate is small in the selectively oxidized layer 408.

Figure 18:
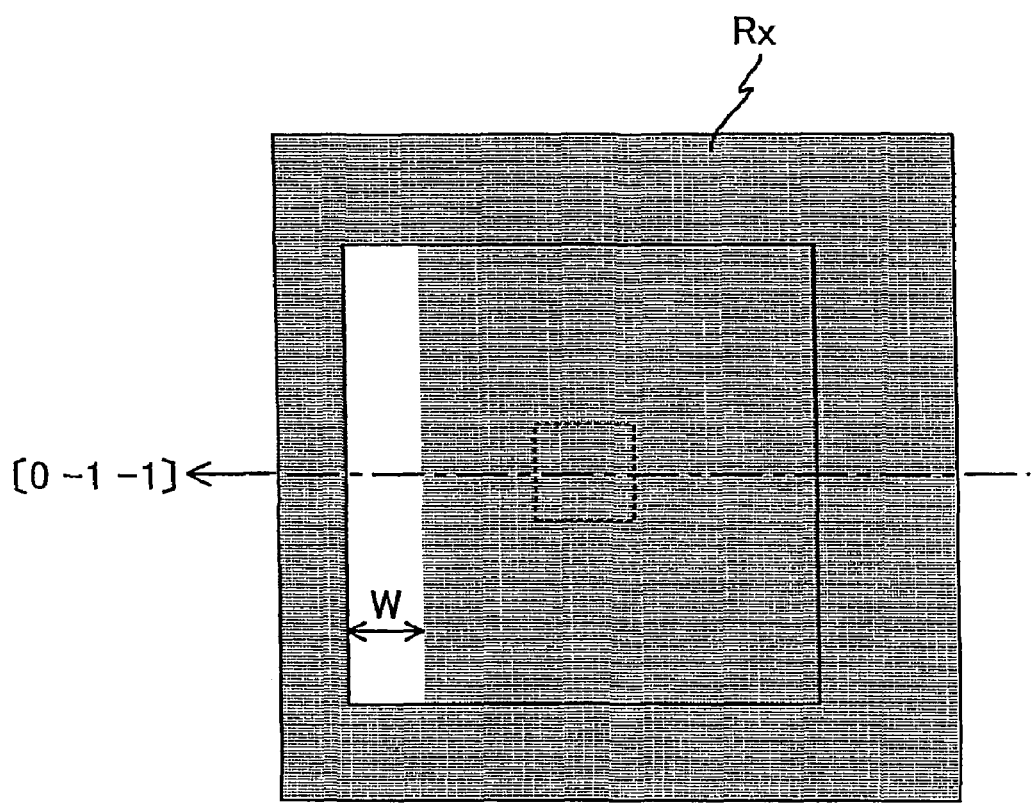
FIG. 18 is a diagram explaining the region where resist formation is made for the second etching process.

(5) Next, a part of the mesa structure excluding the edge region of the width W at the −Y side of the mesa structure (W=3 μm, in the present case) is covered with a resist pattern Rx as shown in FIG. 18.

Figure 19A:
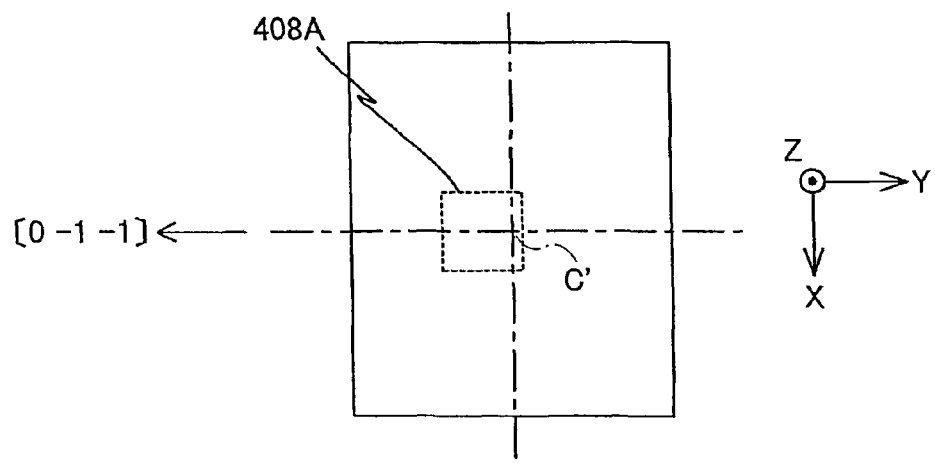
FIGS. 19A and 19B are diagrams for explaining the conductive current confinement region after the second etching process.
Figure 19B:
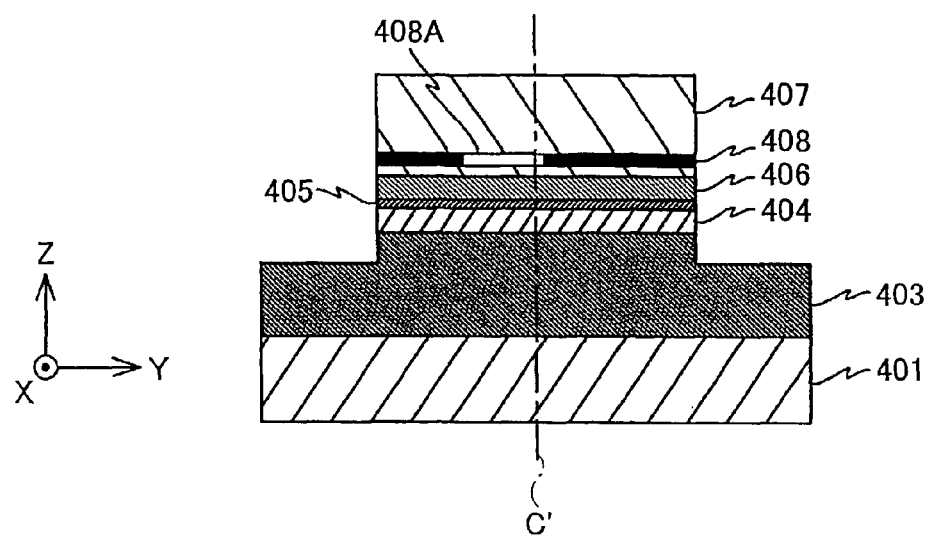

(6) Next, a new mesa structure is formed in the form of rectangular pillar with a center C' by a second ICP etching process that uses a $Cl_2$ gas while using the square resist pattern as a mask. Here, the etching process is controlled such that the bottom of etching is located at the location of the second pair as counted from the top of the lower semiconductor DBR 403. With this, a new mesa structure of square cross-sectional shape is obtained, an example of which is shown in FIG. 19A, wherein the mesa structure has a cross-sectional shape of 27 μm×30 μm in the plane perpendicular to the laser oscillation direction (Z-axis direction). Further, as shown in FIGS. 19A and 19B, it was observed that the center of the conductive current confinement region is displaced from the center C' of the new mesa structure by about 2 μm in the [0-1-1] direction with regard to the laser oscillation direction (Z-axis direction), and hence in the plane perpendicular to the Z-axis direction.

(7) Next, an insulating protective layer of polyimide is formed around the mesa structure.

(8) Next, an upper electrode 412 having an aperture 412A for optical output is formed such that the center of the aperture 412A coincides with the center of the conductive current confinement region 408A with regard to the laser oscillation direction.

(9) Further, a lower electrode 414 is provided on the bottom surface of the substrate 401.

As explained heretofore, the polarization plane of electric field of the oscillation light is stabilized similarly to the case of the surface-emission laser diode 100 of the first embodiment described before also with the surface-emission laser diode 400 of the fourth embodiment because of the displacement of the center of conductive current confinement region 408A from the center C' of the mesa structure with regard to the laser oscillation direction (Z-axis direction), and hence in the plane perpendicular to the Z-axis direction, and it becomes possible to set the polarization direction of the laser light to be coincident to the [0-1-1] direction.

Further, according to the surface-emission laser diode 400 of the fourth embodiment, there is attained anisotropy of optical gain in the active layer 405 as a result of use of inclined substrate for the substrate 401, and it becomes possible to further stabilize the polarization plane of the electric field of the oscillation light.

Further, according to the surface-emission laser diode 400 of the fourth embodiment, it should be noted that the center of the aperture 412A of the upper electrode 412 is coincident to the center of the conductive current confinement region 408A with regard to the laser oscillation direction (Z-axis direction). With this, scattering of the oscillation light with the aperture edge of the upper electrode 412 is eliminated and it becomes possible to obtain stable optical output.

Further, while explanation has been made in the fourth embodiment above with regard to the case of the offset amount of about 1.5 μm for the center of the conductive current confinement region 408A from the center C of the mesa structure with regard to the laser oscillation direction (Z-axis direction), the present invention is by no means limited to such a specific case. In order to induce the desired optical anisotropy in the optical cavity, it is sufficient that the amount of the displacement or offset is 0.5 μm or more (preferably 1 μm or more).

Fifth Embodiment

Figure 20:
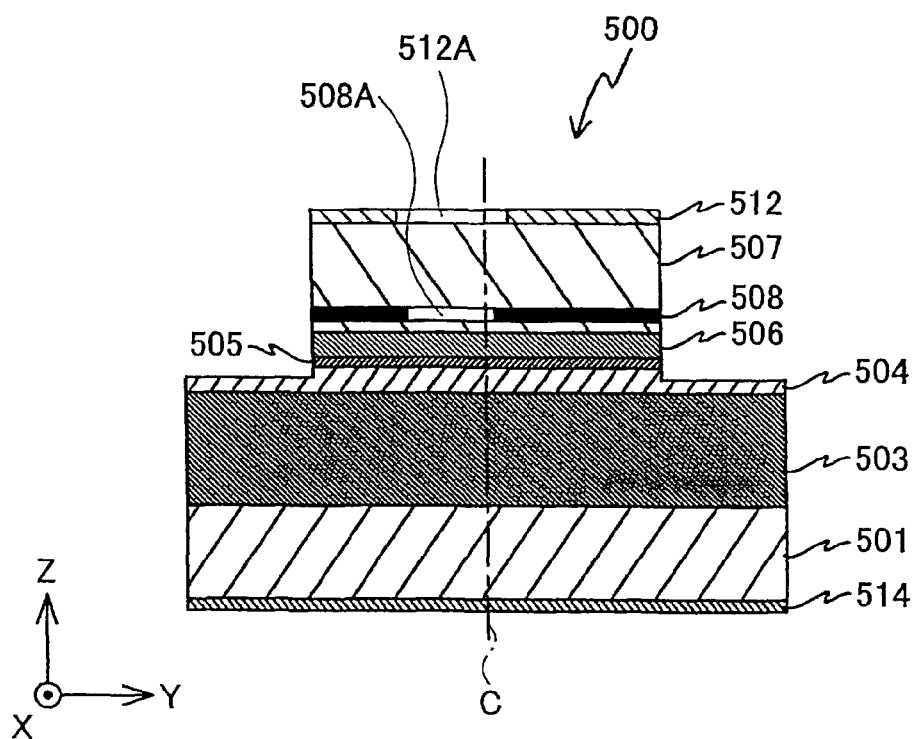
FIG. 20 is a diagram for explaining the general construction of a surface-emission laser diode according to a fifth embodiment of the present invention.

Hereinafter, a fifth embodiment of the present invention will be described with reference to FIGS. 20 through 21B. FIG. 20 shows the schematic construction of a surface-emission laser diode 500 of vertical-cavity surface-emission laser structure according to a fifth embodiment of the present invention.

Referring to FIG. 20, the surface-emission laser diode 500 is a laser of 780 nm band and is formed on a substrate 501 by stacking consecutively a lower semiconductor DBR 503, a lower spacer layer 504, an active layer 505, an upper spacer layer 506, and an upper semiconductor DBR 507, by using an epitaxial growth process. For the sake of convenience, the part formed as a result of lamination of these semiconductor layers will be designated as "fifth stacking body".

The substrate 501 has a mirror polished surface, wherein the substrate 501 is an n-GaAs monocrystalline substrate having a normal direction of the mirror polished surface inclined by 15 degrees with regard to the [100] crystal orientation in the direction toward the [11-1]B crystal orientation. Thus, the substrate 501 is an inclined substrate.

The lower semiconductor DBR 503 includes low-refractive index layers and high-refractive index layers in the form of 42.5 pairs, wherein each pair includes therein a low-refractive index layer of n-$Al_{0.93}Ga_{0.07}As$ and a high-refractive index layer of n-$Al_{0.3}Ga_{0.7}As$.

The lower spacer layer 504 is a layer formed of $Al_{0.33}Ga_{0.67}As$.

The active layer 505 has a triple quantum well structure of GaInAsP/$Al_{0.33}Ga_{0.67}As$.

The upper spacer layer 506 is a layer formed of $Al_{0.33}Ga_{0.67}As$.

The upper semiconductor DBR 507 includes low-refractive index layers and high-refractive index layers in the form of 32 pairs, wherein each pair includes therein a low-refractive index layer of p-$Al_{0.93}Ga_{0.07}As$ and a high-refractive index layer of p-$Al_{0.33}Ga_{0.67}As$.

Thereby, a selective oxidation layer 507 of p-AlAs is inserted into the low-refractive index layer of the upper semiconductor DBR 506 at the location of the second pair as counted from the upper space layer 508 with a thickness of 30 nm.

<<Manufacturing Method>>

Next, manufacturing method of the surface-emission laser diode 500 will be explained briefly.

(1) First, the fifth stacking body is formed by a crystal growth process conducted by molecular beam epitaxy (MBE) growth process.

(2) Next, a rectangular resist patter of the size of 18 μm×20 μm is formed on the surface of the second stacking body.

(3) Next, a mesa structure is formed in the form of rectangular pillar by an ICP etching process that uses a $Cl_2$ gas while using the rectangular resist pattern as a mask. Here, the etching process is controlled such that the bottom of the etching is located in the lower spacer layer 504.

(4) After removing the resist pattern, the fifth stacking body thus formed with the mesa structure is set to the oxidation apparatus 1000, and the selective oxidation process of the selectively oxidized layer 508 is conducted. In the present embodiment, an oxidation condition is used such that the water flow rate is set to 100 g/hr, the $N_2$ carrier gas flow rate is 4 SLM, the holding temperature is 360° C., and the holding duration is 39 minutes.

Figure 21A:
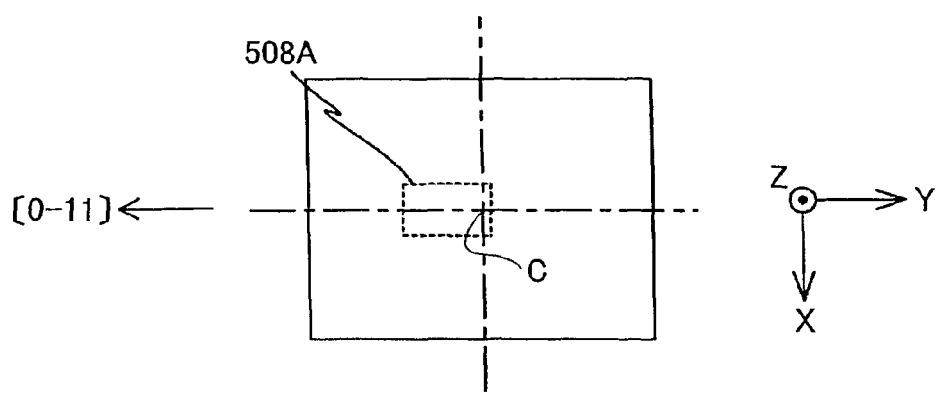
FIGS. 21A and 21B are diagrams for explaining the conductive current confinement region after the selective oxidation processing.
Figure 21B:
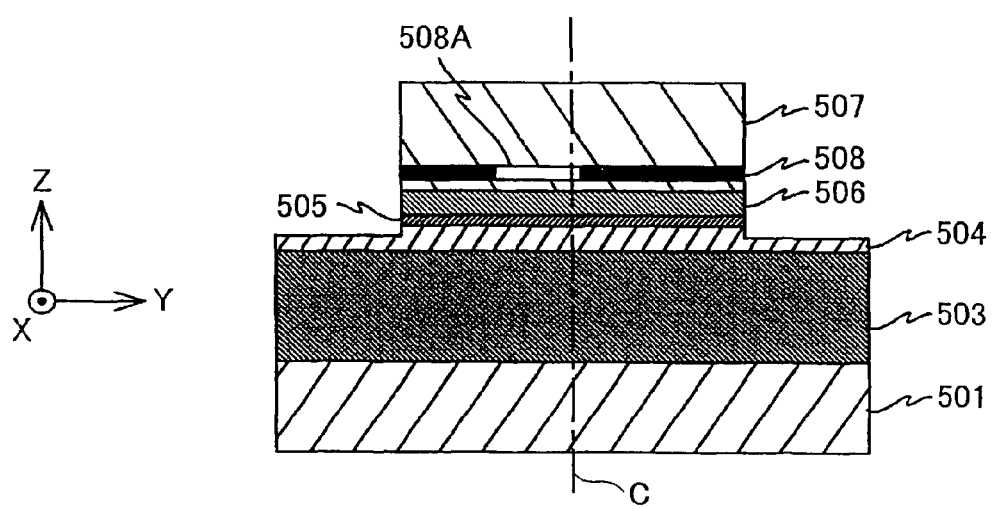

After the selective oxidation process, the selectively oxidized layer 508 was examined with an infrared microscope, and it was observed that there is formed a rectangular conductive current confinement region 508A of the shape of 3 μm×4 μm as shown in FIG. 21A. Further, as shown in FIGS. 21A and 21B, it was observed that the center of the conductive current confinement region 508A was displaced from the center C of the mesa structure by about 2 μm in the [0-1-1] direction with regard to the laser oscillation direction. It should be noted that this reflects the situation of choosing, in the selectively oxidized layer 508, the oxidation condition to satisfy the relationship of: (oxidation rate in [011] direction) >(oxidation rate in [0-11] direction); and (oxidation rate in [0-1-1] direction)>(oxidation rate in [01-1] direction).

(5) Next, an insulating protective layer (not shown) of $SiO_2$ is formed around the mesa structure.

(6) Next, an upper electrode 512 having an aperture for optical output is formed such that the center of the aperture coincides with the center of the conductive current confinement region with regard to the laser oscillation direction.

(7) Further, a lower electrode 514 is provided on the bottom surface of the substrate 501.

As explained heretofore, the polarization plane of electric field of the oscillation light is stabilized similarly to the case of the surface-emission laser diodes of the previously described embodiments also with the surface-emission laser diode 500 of the fourth embodiment because of the displacement of the center of the conductive current confinement region 508A from the center C of the mesa structure with regard to the laser oscillation direction (Z-axis direction), and hence in the plane perpendicular to the Z-axis direction, and it becomes possible to set the polarization direction of the laser light to be coincident to the [0-1-1] direction.

Further, according to the surface-emission laser diode 500 of the fifth embodiment, there is attained anisotropy of optical gain in the active layer 505 as a result of use of inclined substrate for the substrate 501, and it becomes possible to further stabilize the polarization plane of the electric field of the oscillation light.

Further, according to the surface-emission laser diode 500 of the fifth embodiment, it should be noted that the center of the aperture of the upper electrode 512 is coincident to the center of the conductive current confinement region with regard to the laser oscillation direction. With this, scattering of the oscillation light with the aperture edge of the upper electrode 512 is eliminated and it becomes possible to obtain stable optical output.

In each of the foregoing embodiments, the mesa structure may have a cross-sectional shape of any of rectangular shape, polygonal shape, circular shape, elliptic shape, and the like, in the plane perpendicular to the laser oscillation direction. Further, there may be provided plural holes or plural grooves around the mesa structure.

<<Surface-Emission Laser Diode Array>>

Figure 22A:
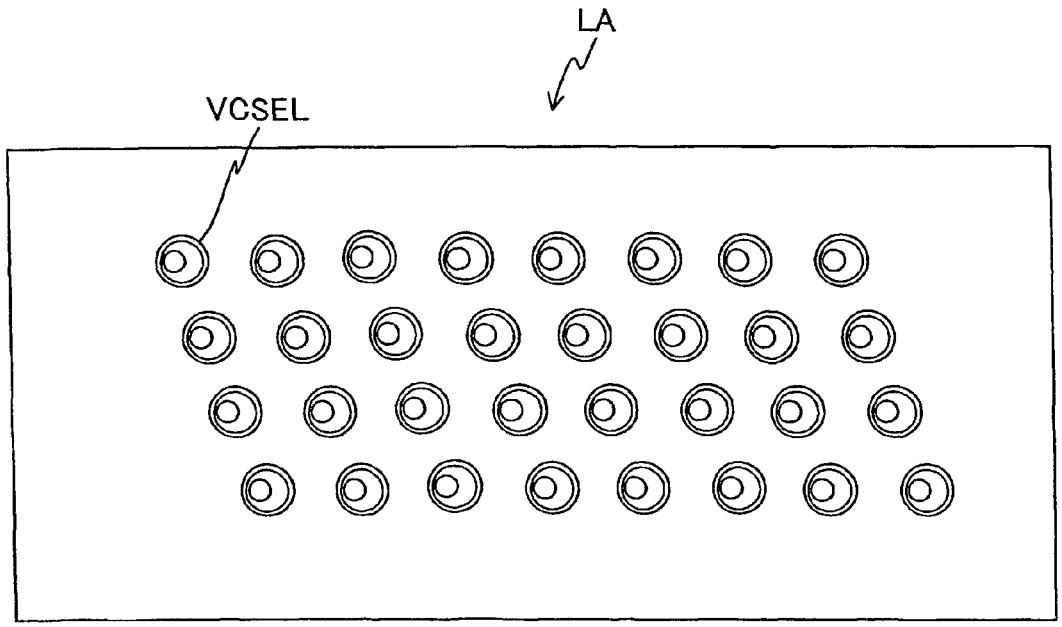
FIGS. 22A and 22B are diagrams for explaining the schematic construction of a surface-emission laser array according to an embodiment of the present invention.

Hereinafter, an embodiment of the surface-emission laser diode array of the present invention will be described with reference to FIGS. 22A through 22B. FIG. 22A shows a schematic construction of a surface-emission laser diode array LA according to an embodiment of the present invention.

This surface-emission laser diode array LA is fabricated by a process similar to those of the surface-emission laser diodes 100-500 explained before and includes a plurality of surface-emission laser diodes (VCSELs) with offset for the center of the conductive current confinement region with regard to the center of the mesa structure with regard to the laser oscillation direction.

Figure 22B:
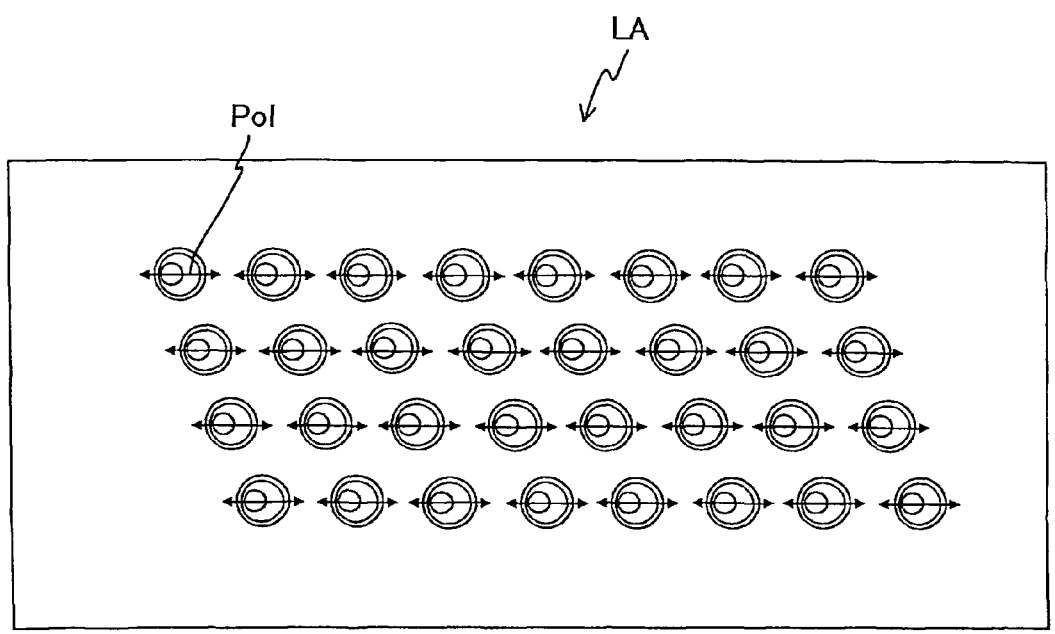

Thus, as shown in FIG. 22B, each of the plurality of surface-emission laser diodes has stabilized polarization plane Pol for the electric field of the oscillation light and has a polarization mode common throughout the surface-emission laser diodes.

<<Image Forming Apparatus>>

Figure 23:
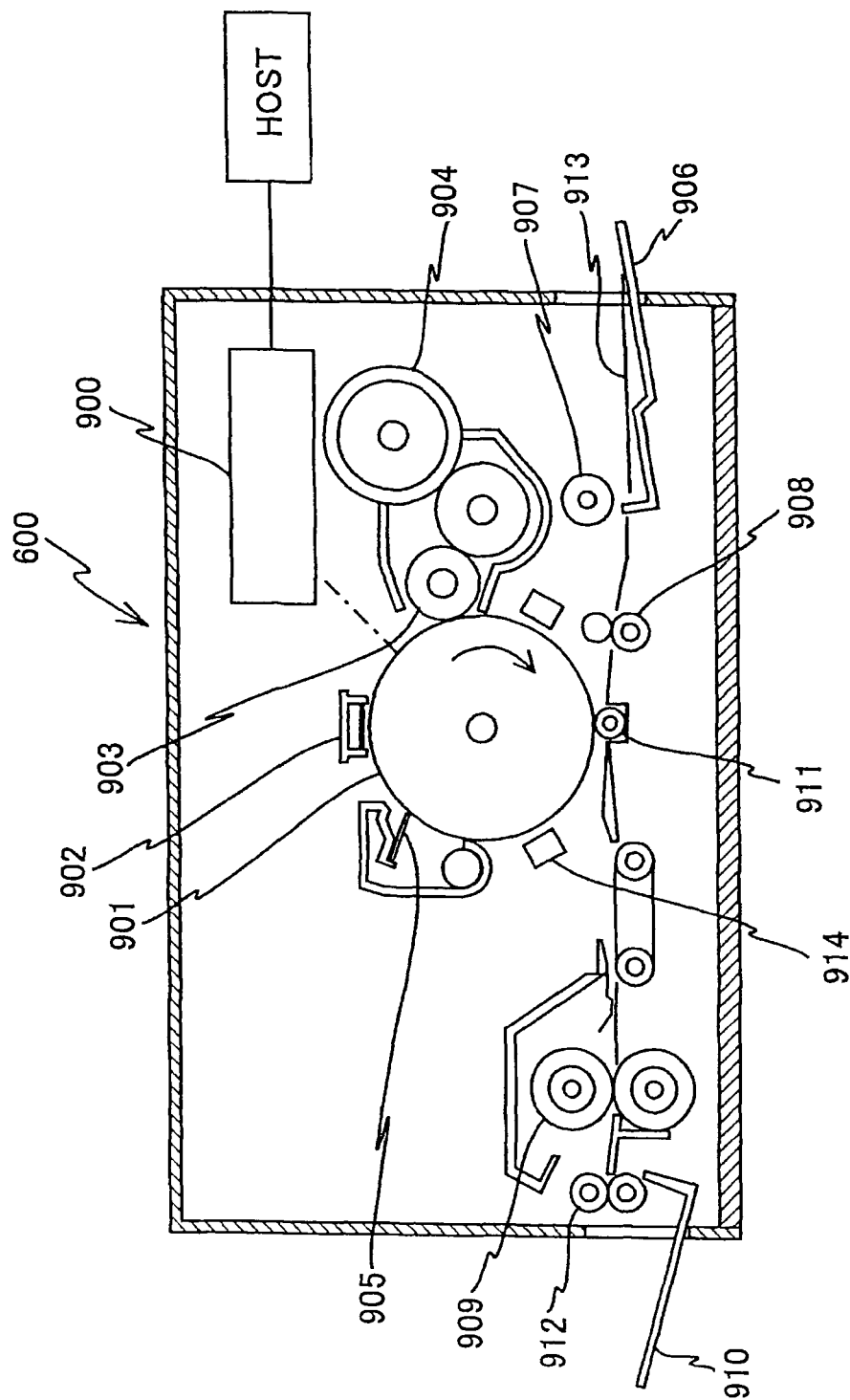
FIG. 23 is a diagram for explaining the schematic construction of a laser printer according to an embodiment of the present invention.

Hereinafter, an image forming apparatus according to an embodiment of the present invention will be described with reference to FIG. 23. FIG. 23 shows a schematic construction of a laser printer 600 as an image forming apparatus according to an embodiment of the present invention.

Referring to FIG. 23, the laser printer 600 comprises an optical scanning apparatus 900, a photosensitive drum 901, an electrostatic charger 902, a developing roller 903, a toner cartridge 904, a cleaning blade 905, a sheet feed tray 906, a sheet feed roller 907, resist roller pairs 908, a transfer charger 911, discharging unit 914, a fixing roller 909, a sheet discharging roller 912, a sheet discharging tray 910, and the like.

The electrostatic charger 902, the developing roller 903, the transfer charger 911, the discharging unit 914 and the cleaning blade 905 are disposed in the vicinity of the surface of the photosensitive drum 901. Thereby, the electrostatic charger 902, the developing roller 903, the transfer charger 911, the discharging unit 914 and the cleaning blade 905 are disposed in the order of: electrostatic charger 902→developing roller 903→transfer charger 911→discharging unit 914→cleaning blade 905, along the rotating direction of the photosensitive drum 901.

The photosensitive drum 901 carries thereon a photosensitive layer. In the present example, the photosensitive drum 901 rotates in the clockwise direction (arrow direction) within the plane of FIG. 23.

The electrostatic charger 902 charges the surface of the photosensitive drum 901 uniformly.

The optical scanning apparatus 900 irradiates a modulated light upon the surface of the photosensitive drum 901 charged with the electric charger 902 with modulation based upon the image information from upper hierarchy apparatus (Host) such as personal computer. With this, there is formed a latent image corresponding to the image information on the surface of the photosensitive drum 901. The latent image thus formed is moved in the direction of the developing roller 903 with rotation of the photosensitive drum 905. This construction of this optical scanning apparatus 900 will be explained later.

The toner cartridge 904 holds toners, and the toners are supplied therefrom to the developing roller 903.

Thus, the developing roller 903 causes the toners supplied from the toner cartridge 904 to adhere to the latent image formed on the surface of the photosensitive drum 901, and with this, development of the image information is attained. The latent image thus formed is moved in the direction of the transfer charger 911 with rotation of the photosensitive drum 901.

The sheet feed tray 906 accommodates therein recording sheets 913. Further, there is disposed a sheet feed roller 907 in the vicinity of the sheet feed tray 906, and the sheet feed roller 907 picks up the recording sheet 913 one by one from the sheet feed tray 906 and supplies the same to the resist roller pair 908. The resist roller pair 908 is disposed in the vicinity of the transfer roller 911 and holds the recording sheet 913 picked up by the sheet feed roller 907 temporarily and supplies the recording sheet to the gap between the photosensitive drum 901 and the transfer charger 911 in synchronization with the rotation of the photosensitive drum 901.

Thereby, the transfer charger 911 is applied with a voltage of reverse polarity to the toners for attracting the toners on the surface of the photosensitive drum 901 to the recording sheet 913 electrically. With this voltage, the toner image on the surface of the photosensitive drum 901 is transferred to the recording sheet 913. The recording sheet 913 thus transferred with the toner image is then forwarded to the fixing roller 909.

With this fixing roller 909, heat and pressure is applied to the recording sheet 913 and the toner image is fixed upon the recording sheet 913. The recording sheet 913 thus fixed with the toner image is forwarded to the sheet discharge tray 901 via the sheet discharging roller 912 and is stuck upon the sheet discharge tray 910 one by one.

The discharging unit 914 discharges the surface of the photosensitive drum 901.

The cleaning blade 905 removes the toner (residual toner) remaining on the surface of the photosensitive drum 901. The residual toners thus removed are used again. After removal of the residual toners, the photosensitive drum 901 returns to the position of the electrostatic charger 902.

<<Optical Scanning Apparatus>>

Next, the construction and function of the optical scanning apparatus 900 will be explained with reference to FIGS. 24 and 25.

Figure 24:
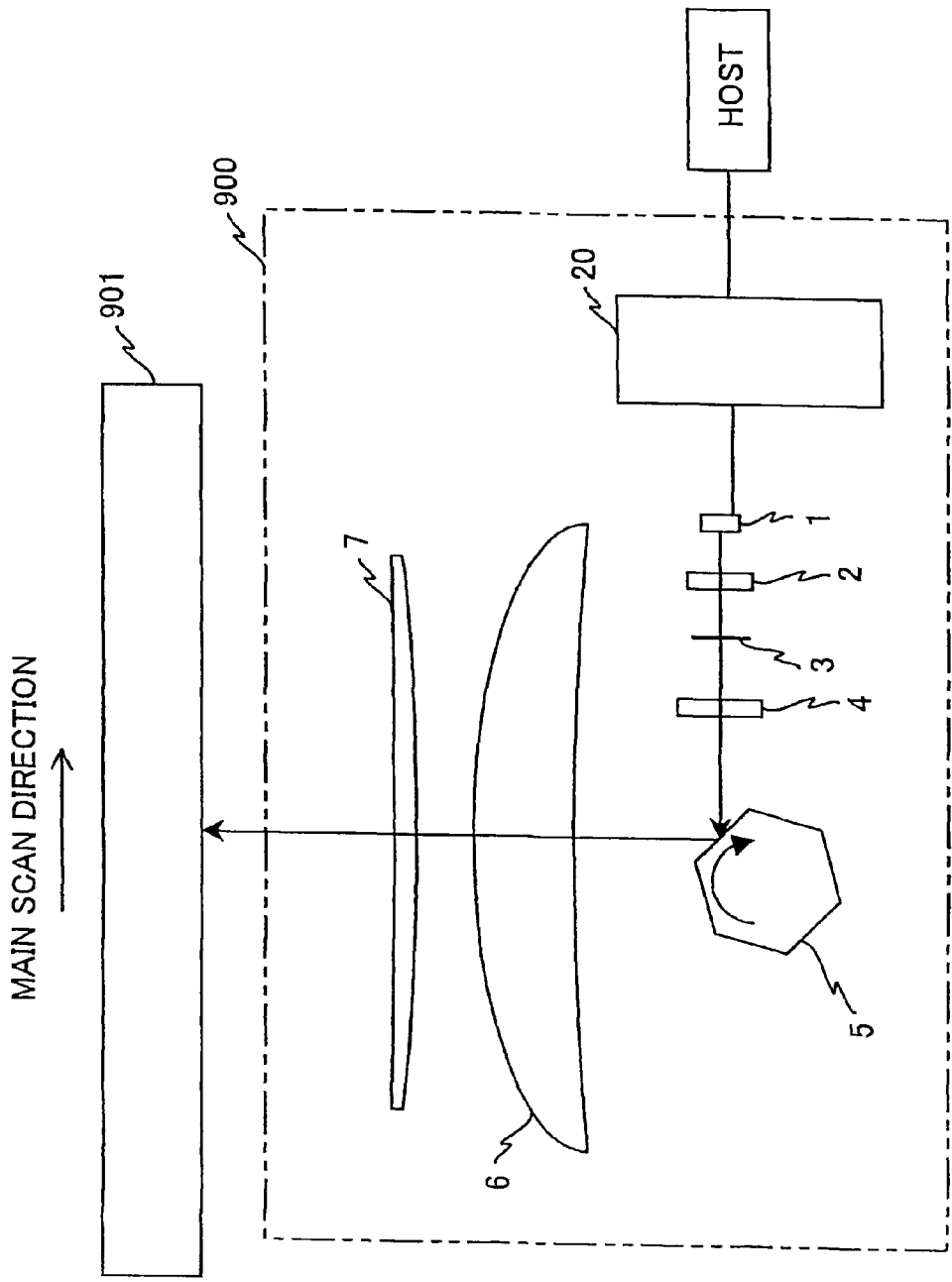
FIG. 24 is a schematic diagram showing the schematic construction of an optical scanning apparatus of FIG. 23.

Referring to FIG. 24, the optical scanning apparatus 900 includes an optical source unit 1, a coupling lens 2, an aperture 3, an anamorphic lens 4, a polygonal mirror 5, a deflector-side scanning lens 6, an image surface-side scanning lens 7, a processing unit 20, and the like.

Figure 25:
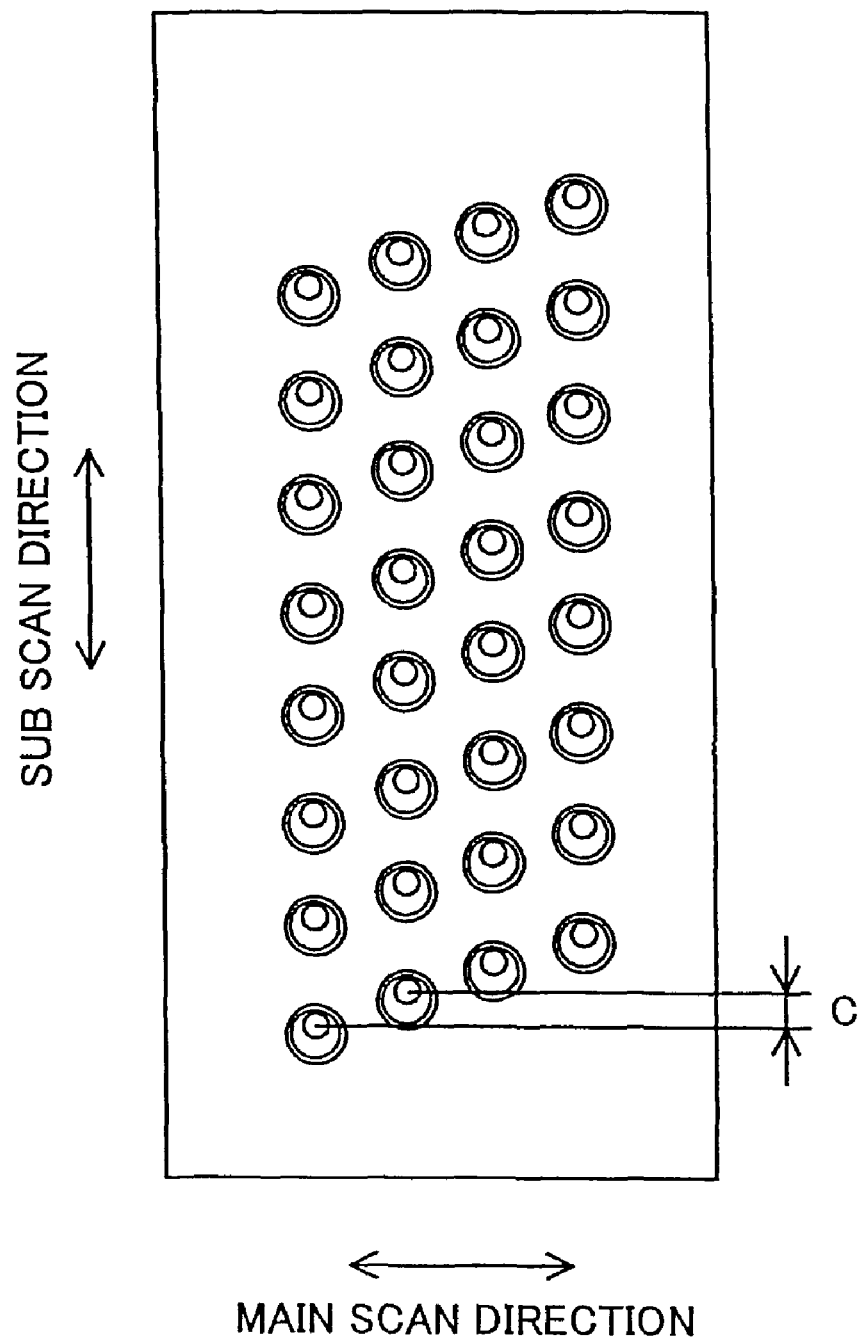
FIG. 25 is a diagram for explaining the surface-emission laser array included in the optical source unit shown in FIG. 24.

The optical source unit 1 includes therein the surface-emission laser diode array LA and is capable of emitting 32 optical beams simultaneously (see FIG. 25).

The coupling lens 2 converts each of the plural optical beams emitted from the optical source unit 1 into a slightly diverging light.

The aperture 3 defines a beam diameter of the plurality of optical beams from the coupling lens 2.

The anamorphic lens 4 converts the each of the plurality of optical beams incident thereto through the aperture 3 into an optical beam having the form of parallel beam with regard to the main scanning direction and the form of a focusing beam focused to the vicinity of the polygonal mirror 5 with regard to the sub-scanning direction.

The plurality of optical beams exited from the anamorphic lens 4 are deflected by the polygonal mirror 5 and focused by the deflector-side scanning lens 6 and the image surface-side scanning lens 7. With this, there are formed optical spots on the surface of the photosensitive drum 901 with a predetermined interval in the sub-scanning direction.

The polygonal mirror 5 is rotated with a motor (not shown) with a constant speed, and the foregoing optical beams are deflected, in response to the rotation of the polygonal mirror 5, with a constant angular velocity. Thereby, each optical spot on the photosensitive drum 901 scans over the surface of the photosensitive drum 901 in the main scanning direction with a constant speed.

The processing unit 20 generates image data based on the image information from an upper hierarchy unit and supplies a drive signal of the surface-emission laser diode array LA to the optical source unit 1 in response to the image data.

With the surface-emission laser diode array LA, the surface-emission laser diodes (VCSEL) therein are formed with such a positional relationship that the interval C between the straight lines drawn perpendicularly to the sub-scanning direction from the respective surface-emission laser diodes in the array becomes constant. Thus, this construction is equivalent to the construction in which the optical sources are aligned with an equal interval in the sub-scanning direction on the photosensitive drum 901, provided that the timing of turn ON of the respective surface-emission laser diodes is adjusted. Further, by adjusting the interval C in the surface-emission laser diode array LA and further the magnification of the optical system, it is possible to adjust the writing interval in the sub-scanning direction on the photosensitive drum 901. For example, it is possible to attain the high-density wiring of 4800 dpi (dot/inch) when the interval C is set to 2.4 μm and the optical magnification is set to about 2.2. Of course, it is possible to attain further increase of recording density by increasing the number of the surface-emission laser diodes in the main scanning direction or by decreasing the interval C further by decreasing the interval between mutually adjacent surface-emission laser diodes in the array in the sub-scanning direction, or by decreasing the optical magnification. Thereby, printing with further improved quality becomes possible. It should be note that the writing interval in the main scanning direction can be easily controlled by adjusting the timing of turn-on of the optical sources.

It should be noted that the optical components used in the optical scanning apparatus 900 has polarization dependence. Because the plurality of optical beams emitted from the surface-emission laser diode array LA have a uniform polarization direction, it is possible to focus the respective optical beams to a desired beam diameter.

Thus, with the optical scanning apparatus 900 of the present embodiment, it becomes possible to scan the photosensitive drum with high density as a result of use of the surface-emission laser diode array LA for the optical source unit 1.

Further, according to the laser printer 600 of the present invention, it becomes possible to form high-definition images with excellent reproducibility as a result of use of the optical scanning apparatus 900.

Further, while the foregoing embodiment has been explained for the case of laser printer 600, the present invention is by no means limited to this specific application. In summary, it becomes possible to produce high-definition images stably with an image forming apparatus that is equipped with the optical scanning apparatus 900.

Further, even in the case of image forming apparatuses that form multicolor images, it is possible to carry out formation of high-definition images at high speed by using optical scanning apparatus adapted to color images.

Figure 26:
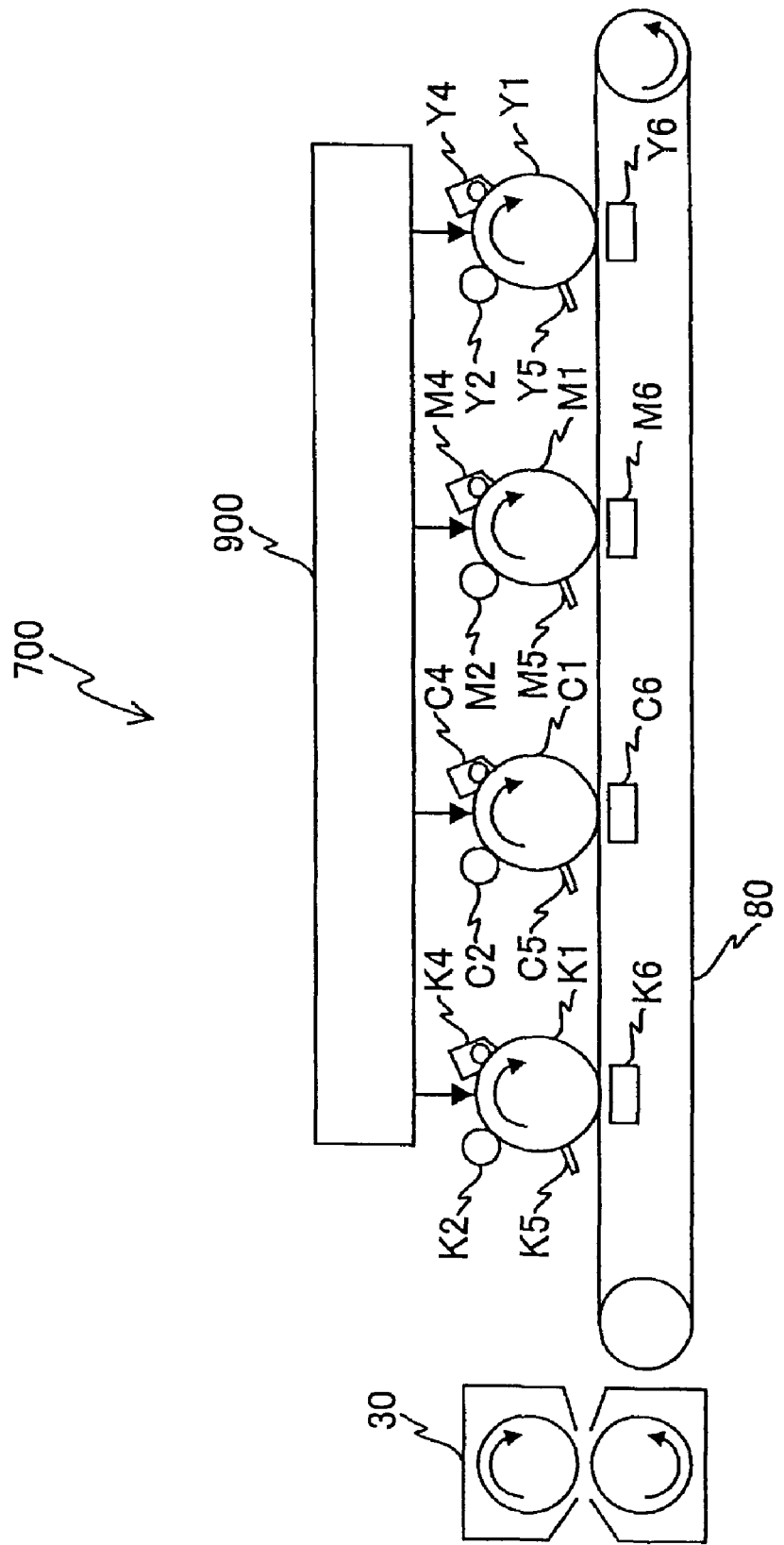
FIG. 26 is a diagram for explaining the schematic construction of a tandem color machine.

For example, the image forming apparatus may be a tandem color apparatus equipped with plural photosensitive drums as shown in FIG. 26. It should be noted that the tandem color apparatus 700 shown in FIG. 26 comprises: a photosensitive drum K1, an electrostatic charger K2, a developing unit K4, cleaning means K5 and transfer charging means K6 for black (K) color; a photosensitive drum C1, an electrostatic charger C2, a developing unit C4, cleaning means C5 and transfer charging means C6 for cyan (C) color; a photosensitive drum M1, an electrostatic charger M2, a developing unit M4, cleaning means M5 and transfer charging means M6 for magenta (M) color; and a photosensitive drum Y1, an electrostatic charger Y2, a developing unit Y4, cleaning means Y5, transfer charging means Y6, an optical scanning apparatus 900, a transfer belt 80 and fixing means 30 for yellow (Y) color, and the like.

In this case, the surface-emission laser array LA of the optical scanning apparatus 900 is divided into a part for black color scanning, a part for cyan color scanning, a part for magenta color scanning and a part for yellow color scanning. Thus, the optical beams from the surface-emission laser diodes for the black color are irradiated upon the photosensitive drum K1; the optical beams from the surface-emission laser diodes for the cyan color are irradiated upon the photosensitive drum C1; the optical beams from the surface-emission laser diodes for the magenta color are irradiated upon the photosensitive drum M1; and the optical beams from the surface-emission laser diodes for the yellow color are irradiated upon the photosensitive drum Y1. Further, the optical scanning apparatus 900 may be equipped with a plurality of surface-emission laser diode arrays LA each for a specific color. Further, the optical scanning apparatus 900 may be provided for each of the colors.

Each of the photosensitive drums causes rotation in the direction of arrows in FIG. 26, and there are provided the charging unit, the developing unit, the transfer charging means and the cleaning means along the direction of rotation of the photosensitive drum. It should be noted that each charging unit charges the surface of the corresponding photosensitive drum uniformly. With irradiation of the optical beam upon the photosensitive drum thus charged by the charging unit from the optical scanning apparatus 900, there is formed an electrostatic latent image on the photosensitive drum. Further, there is formed a toner image on the surface of the photosensitive drum by the corresponding developing unit. Further, the toner images of the respective colors are transferred to a recording sheet by the corresponding transfer charging unit, wherein the color toner image thus formed is fixed upon the recording sheet by the fixing means 30.

With such a tandem color apparatus, there can be a case of color misalignment because of mechanical errors or the like, wherein the optical scanning apparatus 900, using therein the high-density surface-emission laser array, can correct such color misalignment for each of the colors by selecting the surface-emission laser diode elements to be turned on appropriately.

In the case it is not necessary to use plural optical beams, it is possible, with the optical scanning apparatus 900, to use a single surface-emission laser fabricated with a process similar to any of the surface-emission laser diodes 100-500 explained before and the center of the conductive current confinement region is offset from the center of the mesa structure in the laser oscillation direction, in place of the surface-emission laser diode array LA.

Figure 27:
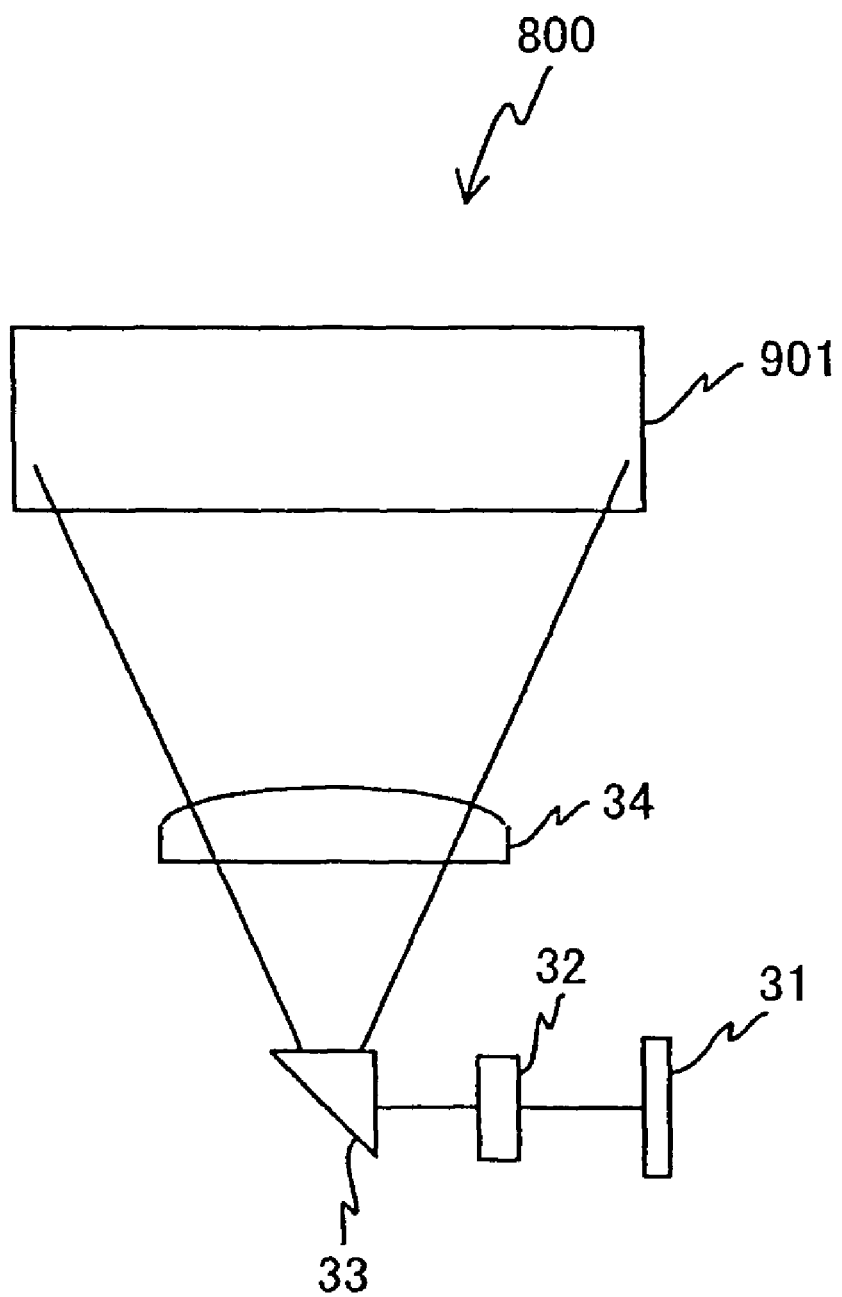
FIG. 27 is a diagram for explaining the general construction of an image forming apparatus having an optical system not using a mechanical rotation structure.

Further, the surface-emission laser diode array LA, or the surface-emission laser diode fabricated according to the process explained with regard to the surface-emission laser diodes 100-500, and thus the conductive current confinement region has a center offset from the center of the mesa structure in the laser oscillation direction, may also be used for the optical source in the image forming apparatus that has an optical system of the type not using mechanical rotation mechanism such as polygonal mirror (see for example, Japanese Patent 371725 and 2677883). FIG. 27 shows an example of such an image forming apparatus 800, in which it will be noted that the image forming apparatus includes an optical source unit 31 including therein the surface-emission layer diode array LA, a collimator lens 32, a fixed mirror 33 and a fθ lens 34, in addition to the photosensitive drum. In this case, too, it is possible to form high-definition images stably similarly to the laser printer 600 explained before.

INDUSTRIAL APPLICABILITY

As explained heretofore, the surface-emission laser diode of the present invention is suitable for stabilizing the polarization mode without inviting increase of cost. Further, the surface-emission laser diode array of the present invention is suitable for aligning the polarization modes of the respective surface-emission laser diodes without inviting increase of cost. Further, according to the optical scanning apparatus of the present invention, it becomes possible to scan a surface with stability. Further, according to the image forming apparatus of the present invention, it becomes possible to form high-definition images.

Further, the present invention is by no means limited to the embodiments described heretofore, but various variations and modifications may be made without departing from the scope of the invention.

The present invention is based on Japanese priority applications No. 2006-233906 and No. 2007-176356, respectively filed on Aug. 30, 2006 and Jul. 4, 2007, which are incorporated herein as reference.

The invention claimed is:

1. A surface-emission laser diode of a vertical-cavity surface-emission laser structure, comprising:
    a substrate; and
    a mesa structure formed over said substrate,
    said mesa structure including therein a current confinement structure,
    said current confinement structure including a conductive current confinement region and an insulation region surrounding said conductive current confinement region,
    said insulation region being an oxide of a semiconductor material forming said conductive current confinement region,
    wherein a center of said current confinement region is offset from a center of said mesa structure in a plane perpendicular to a laser oscillation direction with a distance of 0.5 µm or more.

2. The surface-emission laser diode as claimed in claim 1, wherein said substrate is an inclined substrate.

3. The surface-emission laser diode as claimed in claim 2, wherein said semiconductor material constituting said conductive current confinement region shows anisotropy of oxidation rate.

4. The surface-emission laser diode as claimed in claim 2, wherein said inclined substrate is a mirror polished surface, a normal direction to said mirror polished surface being included in a first plane that includes [100] crystal orientation and a [111] crystal orientation.

5. The surface-emission laser diode as claimed in claim 4, wherein said center of said current confinement region is offset from said center of said mesa structure in a direction of an intersection line formed by said mirror polished surface and said first plane.

6. The surface-emission layer diode as claimed in claim 1, wherein there is formed an upper electrode having an aperture on said mesa structure, and wherein a center of said aperture is coincident to said center of said conductive current confinement region with regard to said laser oscillation direction.

7. A surface-emission laser diode array, comprising a plurality of surface-emission laser diodes formed on a substrate, each of said surface-emission laser diodes comprising:
    a mesa structure formed on said substrate, said mesa structure including therein a current confinement structure, said current confinement structure including a conductive current confinement region and an insulation region surrounding said conductive current confinement region, said insulation region being an oxide of a semiconductor material forming said conductive current confinement region, wherein a center of said current confinement region is offset from a center of said mesa structure in a plane perpendicular to a laser oscillation direction with a distance of 0.5 µm or more.

8. The surface-emission laser diode array as claimed in claim 7, wherein an offset amount and an offset direction of said center of said conductive confinement region with regard to said center of said mesa structure are common throughout said plurality of surface-emission laser diodes.

9. An image forming apparatus forming an image on an object with a plurality of optical beams produced by a surface-emission laser diode array, said surface-emission laser diode array including a plurality of surface-emission laser diodes each comprising:

a substrate; and
a mesa structure formed on said substrate, said mesa structure including therein a current confinement structure, said current confinement structure including a conductive current confinement region and an insulation region surrounding said conductive current confinement region, said insulation region being an oxide of a semiconductor material forming said conductive current confinement region, wherein a center of said current confinement region is offset from a center of said mesa structure in a plane perpendicular to a laser oscillation direction with a distance of 0.5 µm or more.

10. The surface-emission laser diode as claimed in claim 1, wherein said center of said current confinement region is offset from said center of said mesa structure with a distance such that there is attained anisotropy of optical gain and a polarization plane of an electric field of an oscillation light is stabilized.

11. The surface-emission laser diode as claimed in claim 1, wherein the offset as between the center of said current confinement region and the center of said mesa structure is 2 µm or more.

* * * * *